United States Patent
Yoshikawa

(10) Patent No.: US 8,089,094 B2
(45) Date of Patent: Jan. 3, 2012

(54) SEMICONDUCTOR DEVICE

(75) Inventor: Koh Yoshikawa, Matsumoto (JP)

(73) Assignee: Fuji Electric Co., Ltd. (JP)

(*) Notice: Subject to any disclaimer, the term of this patent is extended or adjusted under 35 U.S.C. 154(b) by 236 days.

(21) Appl. No.: 12/466,909

(22) Filed: May 15, 2009

(65) Prior Publication Data

US 2009/0315070 A1    Dec. 24, 2009

(30) Foreign Application Priority Data

May 15, 2008    (JP) .................... 2008-128697

(51) Int. Cl.
*H01L 29/739* (2006.01)

(52) U.S. Cl. ............... 257/139; 257/E29.198; 257/329; 257/341; 257/342

(58) Field of Classification Search ...... 257/E29.027–29.028, E29.066–29.067, 257/E29.194–29.202
See application file for complete search history.

(56) References Cited

U.S. PATENT DOCUMENTS

| | | | |
|---|---|---|---|
| 5,164,804 A | 11/1992 | Terashima | |
| 5,900,662 A | 5/1999 | Frisina et al. | |
| 6,380,586 B1 | 4/2002 | Yoshikawa | |
| 6,683,347 B1 | 1/2004 | Fujihira | |
| 6,737,705 B2 | 5/2004 | Momota et al. | |

FOREIGN PATENT DOCUMENTS

| | | |
|---|---|---|
| JP | 04-127480 A | 4/1992 |
| JP | 09-232567 A | 9/1997 |
| JP | 2000-040822 A | 2/2000 |
| JP | 2000-228519 A | 8/2000 |
| JP | 2001-308327 A | 11/2001 |
| JP | 2004-193212 A | 7/2004 |
| JP | 2006-294968 A | 10/2006 |

*Primary Examiner* — Fernando L Toledo
*Assistant Examiner* — Mamadou Diallo
(74) *Attorney, Agent, or Firm* — Rossi, Kimms & McDowell LLP

(57) ABSTRACT

A power semiconductor device is provided, that realizes high-speed turnoff and soft switching at the same time, includes n-type main semiconductor layer including lightly doped n-type semiconductor layer and extremely lightly doped n-type semiconductor layer arranged alternately and repeatedly between p-type channel layer and field stop layer and in parallel to the first major surface of n-type main semiconductor layer. Extremely lightly doped n-type semiconductor layer is doped more lightly than lightly doped n-type semiconductor layer. Lightly doped n-type semiconductor layer prevents a space charge region from expanding at the time of turnoff. Extremely lightly doped n-type semiconductor layer expands the space charge region at the time of turnoff to eject electrons and holes quickly further to realize high-speed turnoff. The pattern of arrangement of the lightly doped n-type semiconductor layer and extremely lightly doped n-type semiconductor layer is independent of the arrangement pattern of the gate electrode structure.

6 Claims, 17 Drawing Sheets

SEMICONDUCTOR DEVICE

BACKGROUND

The present invention relates to insulated gate bipolar transistors, (hereinafter referred to as "IGBT's") and diodes that constitute power semiconductor devices.

Power semiconductor devices have generally been used for non-contact switches. Therefore, it has been required for the power semiconductor devices to cause less losses therein. For reducing the losses caused therein, ON-state voltage lowering and switching loss reduction have been explored. It has been known to the persons skilled in the art that there exits a tradeoff relationship between the ON-state voltage and the switching (turnoff) loss of the power semiconductor devices. This tradeoff relationship is called the "ON-state-voltage turnoff-power-loss tradeoff relationship" for the IGBT's and the "forward-voltage reverse-recovery-loss tradeoff relationship" for the diodes.

These tradeoff relationships are the indices of loss generation in the power devices that have been required to be improved. The ON-state-voltage turnoff-power-loss tradeoff relationship and the soft switching performances are not simultaneously improved very often by the conventional methods known to persons skilled in the art. Therefore, it has been an important problem to improve both the ON-state-voltage turnoff-power-loss tradeoff relationship and the soft switching performances at the same time. Especially, since the turnoff-power-loss reduction is affected by the high-speed switching performances, it is important to improve the high-speed switching performances and the soft switching performances at the same time.

Recently, methods that control the excess carriers in the ON-state have been proposed for improving the ON-state-voltage turnoff-power-loss tradeoff characteristics of the IGBT's. For example, in the trench-type insulated gate bipolar transistor proposed in Japanese Unexamined Patent Application Publication No. 2000-228519, p-type well regions are formed selectively in the surface portion of an n-type drift layer such that the n-type drift layer has extended portions between the p-type well regions and the ratio Wt/Wp of the width Wt of the trench in the trench gate structure and the width Wp of the p-type well region is set at a value between 1 and 20.

Japanese Unexamined Patent Application Publication No. 2001-308327 proposes an insulated gate semiconductor device that includes a p-type base layer including a first region between a pair of trenches and a second region between an adjacent pair of trenches. The first region and $n^+$-type source regions formed in the surface portions of the first region are in contact with an emitter electrode. The second region is not in contact with any emitter electrode. The ratio of the width of the first region to the width of the second region is set to be from 1:2 to 1:7.

Japanese Unexamined Patent Application Publication No. 2004-193212 proposes an improvement for semiconductor substrates which includes an $n^+$-type buffer region and a first $n^-$-type drift region in a drift region. The thickness of the first $n^-$-type drift region and the impurity dose amount in the $n^+$-type buffer region are determined so that the edge of the depletion layer expanding in the first $n^-$-type drift region, when a rated voltage is applied, may stop in the $n^+$-type buffer region. The semiconductor substrate further includes a second $n^-$-type drift region spaced apart from first $n^-$-type drift region for the $n^+$-type buffer region. The thickness of the second $n^-$-type drift region is set at a predetermined value.

Japanese Unexamined Patent Application Publication No. 2000-40822 proposes a super-junction semiconductor device including a semiconductor substrate region, that makes a current flow in the ON-state of the device and that is depleted in the OFF-state of the device. The semiconductor substrate region includes a plurality of vertical alignments of n-type buried regions and a plurality of vertical alignments of p-type buried regions. The vertical alignments of n-type buried regions and the vertical alignments of p-type buried regions are alternately arranged horizontally and periodically.

Japanese Unexamined Patent Application Publication No. 2006-294968 proposes a semiconductor device including a heavily doped n-type drain layer and an intermediate layer on the n-type drain layer. The intermediate layer is made of n-type Si and doped more lightly than the n-type drain layer. Through the intermediate layer, n-type layers made of n-type Si, doped more lightly than the drain layer and doped more heavily than the intermediate layer, are formed. The n-type layers work for a drift layer that provides a main current path when the device is operating. Further, p-type layers made of p-type Si are formed through the intermediate layer.

Japanese Unexamined Patent Application Publication No. Hei. 9 (1997)-232567 proposes a MOS-gate power device that includes a plurality of elementary functional units, each including a p-type body region formed in an n-type semiconductor material layer having a first resistivity value. Under each body region, a lightly doped n-type region having a second resistivity value higher than the first resistivity value is provided.

In the foregoing and following descriptions, electrons are majority carriers in the layer or the region with the prefix "n-type". In the layer or the region with the prefix "p-type", holes are majority carriers. The suffix "+" on the shoulder of the letter "n" or "p" indicating the conductivity type of the layer or the region indicates that the layer or the region is doped relatively heavily. The suffix "−" on the shoulder of the letter "n" or "p" indicating the conductivity type of the layer or the region indicates that the layer or the region is doped relatively lightly.

FIG. 20 is a cross sectional view showing the structure of a conventional trench-gate IGBT. As shown in FIG. 20, p-type channel layer 2 is formed in the surface portion on the side of the first major surface of lightly doped n-type main semiconductor layer 1. In the surface portion on the side of the second major surface of lightly doped n-type main semiconductor layer 1, heavily doped p-type collector layer 3 is formed. In n-type main semiconductor layer 1, uniformly doped n-type base layer 4 is disposed between p-type channel layer 2 and p-type collector layer 3. Between n-type base layer 4 and p-type collector layer 3, $n^+$-type field stop layer 5 is disposed.

In the surface portion of p-type channel layer 2, $n^+$-type emitter region 6 is formed selectively. In the surface portion of n-type main semiconductor layer 1 on the first major surface side, stripe-shaped trenches 7 are formed. Trench 7 is in contact with $n^+$-type emitter region 6 and extended from the first major surface of n-type main semiconductor layer 1 to n-type base layer 4 through p-type channel layer 2. Gate electrode 9 is disposed in trench 7 with gate insulator film 8 interposed between gate electrode 9 and the inner wall of trench 7.

On the first major surface of n-type main semiconductor layer 1, interlayer insulator film 10 is disposed such that interlayer insulator film 10 covers gate electrode 9. On the first major surface of n-type main semiconductor layer 1, emitter electrode 11 formed of a metal film is disposed such that emitter electrode 11 is covering interlayer insulator film 10 and in contact with $n^+$-type emitter region 6. In the surface portion of p-type channel layer 2, p$^+$-type body region 12 is formed selectively. Emitter electrode 11 is connected electrically to p-type channel layer 2 via p$^+$-type body region 12. Sometimes, a nitride film, an amorphous silicon film or a polyimide film is formed on emitter electrode 11 for a passivation film, although not illustrated in FIG. 20. Collector electrode 13 formed of a metal film is formed on p-type collector layer 3.

FIG. 21 is a cross sectional view showing the structure of a conventional planar-gate IGBT. As shown in FIG. 21, the impurity concentration distribution in n-type base layer 4 in the conventional planar-gate IGBT is uniform. In the surface portion on the side of the first major surface of n-type main semiconductor layer 1, p-type channel region 22 is formed selectively. In the surface portion of p-type channel region 22, n$^+$-type emitter region 6 and p$^+$-type body region 12 are formed selectively. Gate insulator film 8 is formed along the surface of p-type channel region 22 between n$^+$-type emitter region 6 and n-type base layer 4. Gate electrode 9 is on gate insulator film 8. Gate electrode 9 is insulated from the regions in n-type main semiconductor layer 1 except p-type channel region 22 by the insulator film extending from gate insulator film 8. The other configurations are the same with those of the trench-gate IGBT shown in FIG. 20.

Now the operations of the IGBT while the IGBT is shifting form the OFF-state thereof to the ON-state thereof will be described below. As emitter electrode 11 is grounded and a voltage higher than the ground potential is applied to collector electrode 13 in the OFF-state of the IGBT, the IGBT is brought into an OFF-state under a voltage lower than the breakdown voltage due to the reversely biased junction between n-type base layer 4 and p-type channel layer 2 (p-type channel region 22). In this state, a voltage higher than the threshold voltage is applied from a not-shown gate driver circuit to gate electrode 9 via gate resistance. By the gate voltage application, electric charges start being accumulated on gate electrode 9. At the same time, an n-type channel region (not shown) reversed to the n-type is formed in the region of p-type channel layer 2 (p-type channel region 22) in contact with gate insulator film 8.

As the n-type channel region is formed between n$^+$-type emitter region 6 and n-type base layer 4, the reversely biased junction vanishes from the path extending through the n-type channel region. Therefore, electrons are injected from emitter electrode 11 to n-type base layer 4 via n$^+$-type emitter region 6 and the n-type channel region. Since the pn-junction on the collector side is biased in forward as the electron injection occurs, holes that are minority carriers are injected from p-type collector layer 3 to n-type base layer 4. As the holes are injected to n-type base layer 4, the concentration of the electrons that are majority carriers rises to maintain the neutral condition of the carriers in n-type base layer 4. As a result, the resistance of n-type base layer 4 is lowered. In short, the so-called conductivity modulation occurs. The voltage drop caused, when conductivity modulation occurs, by the current flowing between collector electrode 13 and emitter electrode 11 is the ON-state voltage.

Now the operations of the IGBT while the IGBT is shifting form the ON-state thereof to the OFF-state thereof will be described below. As the voltage between emitter electrode 11 and gate electrode 9 exceeds the threshold value to the lower side in the ON-state of the IGBT, the electric charges accumulated on gate electrode 9 are discharged to the gate driver circuit via the gate resistance. By the discharge, the channel region reversed to the n-type in p-type channel layer 2 (p-type channel region 22) returns to the p-type, making the channel region vanish. Therefore, the electron feed from emitter electrode 11 to n-type base layer 4 vanishes. However, a current keeps flowing until the electrons and holes accumulated in n-type base layer 4 are swept out to collector electrode 13 and emitter electrode 11 or recombine to vanish. After the electrons and holes in n-type base layer 4 vanish, the current does not flow and the IGBT is in the OFF-state thereof.

For realizing high-speed turnoff, it is necessary to increase the speed, at which the carriers accumulated in the n-type base layer are swept out at the turnoff, or the speed, at which the carriers accumulated in the n-type base layer recombine at the turnoff. However, as all the accumulated carriers are swept out by the space charge region while the voltage is rising or the current is decreasing in the early stage of turnoff, the current becomes 0 rapidly. Due to this, the left side of the following formula (1) describing the relation between the voltage and the current reduction rate becomes large rapidly and the collector voltage rises rapidly, causing hard switching. If hard switching is caused, voltage oscillation will be caused or over voltage breakdown will be caused. In the formula (1), V represents the voltage generated, Lc the wiring inductance, Ic the collector current and dIc/dt the time differentiation of the collector current.

$$V = -Lc \cdot dIc/dt \quad (1)$$

However, the conventional IGBT's described above have the problems as described below. In the semiconductor device disclosed in Japanese Unexamined Patent Application Publication No. 2004-193212, soft switching will be realized, if the accumulated charges are not swept out completely by the space charge region while the voltage is rising or the current is decreasing in the early stage of turnoff. However, it is difficult to realize high-speed turnoff, since the electrons and holes remaining in the neutral region decrease by diffusion or recombination. Since the semiconductor devices disclosed in Japanese Unexamined Patent Application Publication No. 2000-228519 and Japanese Unexamined Patent Application Publication No. 2001-308327 are subject to a size limitation and such a limitation on the emitter-side surface structure, it is necessary to design the semiconductor devices within the limitations. Since it is necessary for the semiconductor device disclosed in Japanese Unexamined Patent Application Publication No. Hei. 9(1997)-232567 to form a lightly doped n-type region under a p-type region, design freedom is limited. It is necessary for the semiconductor devices disclosed in Japanese Unexamined Patent Application Publication No. 2000-40822 and Japanese Unexamined Patent Application Publication No. 2006-294968 to secure charge valance between the p-type semiconductor layer and the n-type semiconductor layer in the semiconductor substrate, but since pn-junctions exist in the semiconductor substrate in the semiconductor devices, input capacitance increase is caused and high-speed turnoff is prevented from occurring. If the second region of the p-type base layer not in contact with any n$^+$-type source region is omitted from the semiconductor device disclosed in Japanese Unexamined Patent Application Publication No. 2001-30832, the breakdown voltage will be lowered greatly. If the p-type buried regions are omitted from semiconductor device disclosed in Japanese Unexamined Patent Application Publication No. 2000-40822, the breakdown voltage will be lowered greatly.

In view of the foregoing, it would be desirable to obviate the problems described above. It would be also desirable to provide a semiconductor device that facilitates realizing high-speed turnoff and soft switching at the same time.

SUMMARY OF THE INVENTION

According to the invention, a semiconductor device is provided that includes: a main semiconductor layer of a first conductivity type having a first major surface and a second major surface, the main semiconductor layer having an impurity concentration distribution, in which the impurity concentration repeats increasing and decreasing in parallel to the first major surface. A channel region of a second conductivity type is formed on the first major surface side of the main semiconductor layer. An emitter region of the first conductivity type is formed in the channel region. In the channel region, a gate insulator film in contact with the channel region is formed between a region of the first conductivity type and the emitter region. The region of the first conductivity type is in the main semiconductor layer and in contact with the channel region. A gate electrode is in contact with the gate insulator film. A collector layer of the second conductivity type is formed on the second major surface side of the main semiconductor layer. A field stop layer of the first conductivity type is formed between the main semiconductor layer and the collector layer. The field stop layer is doped more heavily that the main semiconductor layer. An emitter electrode is connected electrically to the emitter region and the channel region. A collector electrode is connected electrically to the collector layer.

Advantageously, the impurity concentration distribution in the main semiconductor layer is caused by a relatively heavily doped layer and a relatively lightly doped layer shaped with respective stripes and alternately arranged repeatedly. Advantageously, the impurity concentration in the relatively heavily doped layer is the same with the impurity concentration in the conventional main semiconductor layer doped lightly. In this case, the impurity concentration in the relatively lightly doped layer is lower than the impurity concentration in the conventional main semiconductor layer doped lightly. Therefore, the relatively heavily doped layer will be referred to hereinafter as the "lightly doped semiconductor layer" and the relatively lightly doped layer will be referred to hereinafter as the "extremely lightly doped semiconductor layer".

The lightly doped semiconductor layer prevents the space charge region from expanding at the time of turnoff. Therefore, the lightly doped semiconductor layer is set so that a neutral region may remain on the field stop layer side in the lightly doped semiconductor layer at the time of turnoff. The extremely lightly doped semiconductor layer expands the space charge region at the time of turnoff to eject electrons and holes quickly. At the time of turnoff, the space charge region expanding in the extremely lightly doped semiconductor layer reaches the field stop layer more quickly than the space charge region expanding in the lightly doped semiconductor layer. In other words, the extremely lightly doped semiconductor layer is disposed for realizing high-speed turnoff.

Advantageously, the ratio of the highest impurity concentration and the lowest impurity concentration in the main semiconductor layer is equal to or more than 2. Advantageously, the gate structure is a trench gate structure. Advantageously, the gate structure is a planar-type gate structure. Advantageously, the interval, at which the impurity concentration in the main semiconductor layer changes, and the interval, at which the gate electrode structure including the gate insulator film and the gate electrode is arranged repeatedly, are different from each other.

Due to the extremely lightly doped semiconductor layer that expands the space charge region at the time of turnoff, more electrons and holes are ejected by the voltage rise. Since the time differentiation value of the collector current ($dI_c/dt$) in the foregoing formula (1)) becomes small due to the ejection of more electrons and holes, the collector voltage is prevented from rising rapidly. The space charge region expanding from the extremely lightly doped semiconductor layer reaches the field stop layer while the current is decreasing. However, since the space charge region is prevented from expanding in the lightly doped semiconductor layer, a neutral region remains on the field stop layer side in the main semiconductor layer. Due to the mechanism described above, hard switching that causes rapid voltage rise is not caused. In short, soft switching is realized.

The neutral regions that remain in the main semiconductor layer at the time of turnoff are less than the neutral regions that remain in the conventional semiconductor device at the time of turnoff thereof. Therefore, the numbers of the electrons and the holes which vanish by diffusion and recombination are smaller than those in the conventional semiconductor device. Since it takes a time for the electrons and holes to vanish through diffusion and recombination, high-speed turnoff will be realized, if the numbers of the electrons and the holes which vanish through the processes described above decrease. Since the area of the space charge region edge is wider than that in the conventional semiconductor device, high-speed turnoff is realized.

The semiconductor device according to the invention facilitates realizing high-speed turnoff and soft switching at the same time.

Other features, advantages, embodiments and modifications of the invention will be apparent to those skilled in the art from the following detailed description of the preferred embodiments of the invention.

BRIEF DESCRIPTIONS OF THE DRAWINGS

The invention will be described with reference to certain preferred embodiments thereof and the accompanying drawings, wherein.

DETAILED DESCRIPTION OF THE PREFERRED EMBODIMENTS

Figure 1:
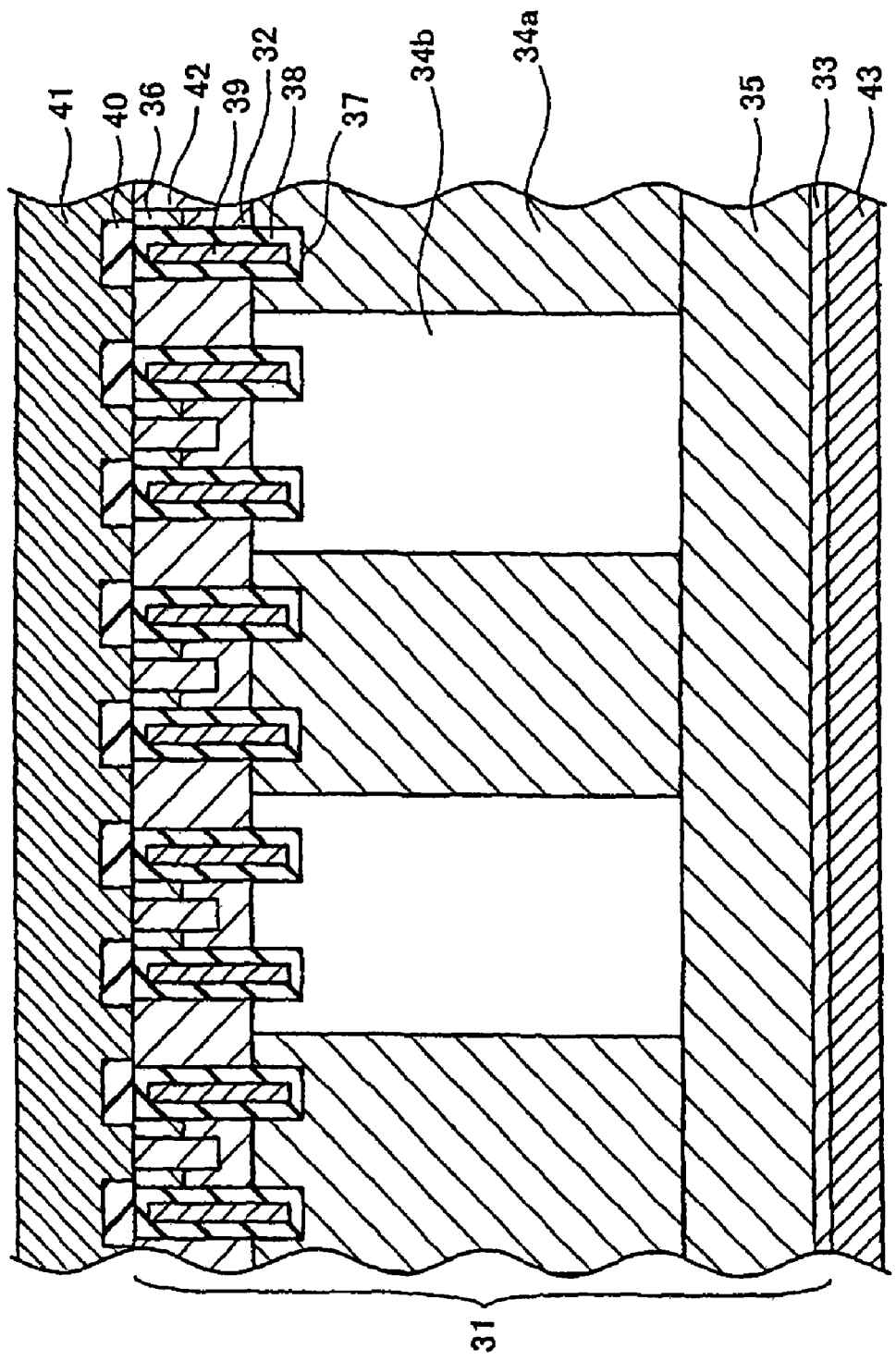
FIG. 1 is a cross sectional view showing the structure of a semiconductor device according to a first mode for carrying out the invention.

FIG. 1 is a cross sectional view showing the structure of a semiconductor device according to a first mode for carrying out the invention. As shown in FIG. 1, the semiconductor device according to the first mode for carrying out the invention is a trench-gate IGBT. In the surface portion of n-type main semiconductor layer 31 on the first major surface side thereof, p-type channel layer (channel region) 32 is formed. In the surface portion of n-type main semiconductor layer 31 on the second major surface side thereof, heavily doped p-type collector layer 33 is formed. In n-type main semiconductor layer 31, lightly doped n-type semiconductor layer (hereinafter referred to as "LDN layer") 34a or extremely lightly doped n-type semiconductor layer (hereinafter referred to as "XLDN layer") 34b is formed between p-type channel layer 32 and p-type collector layer 33. LDN layer 34a is doped more heavily than XLDN layer 34b. LDN layer 34a and XLDN layer 34b are shaped, for example, with respective stripes extending along the first major surface of n-type main semiconductor layer 31. LDN layer 34a and XLDN layer 34b are arranged alternately and repeatedly between p-type channel layer 32 and p-type collector layer 33. Between the repetitive arrangement of n-type semiconductor layers 34a, 34b and p-type collector layer 33, n$^+$-type field stop layer 35 doped more heavily than LDN layer 34a is disposed.

In the surface portion of p-type channel layer 32, n$^+$-type emitter region 36 and p$^+$-type body region 42 are formed selectively. In the surface portion of n-type main semiconductor layer 31 on the first major surface side thereof, stripe-shaped trenches 37 are formed. Trench 37 is formed in adjacent to n$^+$-type emitter region 36 and extended from the first major surface of n-type main semiconductor layer 31 into LDN layer 34a or XLDN layer 34b through p-type channel layer 32. Gate electrode 39 is disposed in trench 37 with gate insulator film 38 interposed between gate electrode 39 and the inner wall of trench 37.

On the first major surface of n-type main semiconductor layer 31, interlayer insulator film 40 is formed such that interlayer insulator film 40 covers gate electrode 39. On the first major surface of n-type main semiconductor layer 31, emitter electrode 41 formed of a metal film is formed such that emitter electrode 41 covering interlayer insulator film 40 is in contact with n$^+$-type emitter region 36 and p$^+$-type body region 42. Emitter electrode 41 is connected electrically to p-type channel layer 32 via p$^+$-type body region 42. Collector electrode 43 formed of a metal film is formed on p-type collector layer 33. Although not illustrated in FIG. 1, a passivation film formed of a nitride film, an amorphous silicon film or a polyimide film is formed sometimes on emitter electrode 41.

The impurity concentration in LDN layer 34a is almost the same with the impurity concentration in the lightly doped main semiconductor layer in the conventional IGBT. The impurity concentration in XLDN layer 34b doped more lightly than LDN layer 34a is lower than the impurity concentration in the lightly doped main semiconductor layer in the conventional IGBT. LDN layer 34a plays the role of preventing a space charge region from expanding at the turnoff of the IGBT. Therefore, LDN layer 34a is set so that a neutral region may remain in the portion of LDN layer 34a on the side of field stop layer 35 at the turnoff of the IGBT. By making a neutral region remain in the portion of LDN layer 34a on the side of field stop layer 35 at the turnoff of the IGBT, soft switching is realized.

XLDN layer 34b plays the role of expanding the space charge region at the turnoff of the IGBT and ejecting electrons and holes quickly. At the turnoff of the IGBT, the space charge region expanding into XLDN layer 34b reaches field stop layer 35 more quickly than the space charge region expanding into LDN layer 34a, realizing high-speed turnoff.

It is preferable for the ratio of the impurity concentration in LDN layer 34a and the impurity concentration in XLDN layer 34b to be equal to or more than 2. At the preferable impurity concentration ratio, the effect of high-speed turnoff and the effect of soft switching are satisfactorily obtained at the same time. The arrangement pattern of LDN layer 34a and XLDN layer 34b does not depend on the arrangement pattern of the surface structure including the gate electrode structure and n$^+$-type emitter region 36. In other words, the impurity concentration distribution in n-type main semiconductor layer 31 can be designed freely and independently of the arrangement pattern of the IGBT surface structure.

Figure 2:
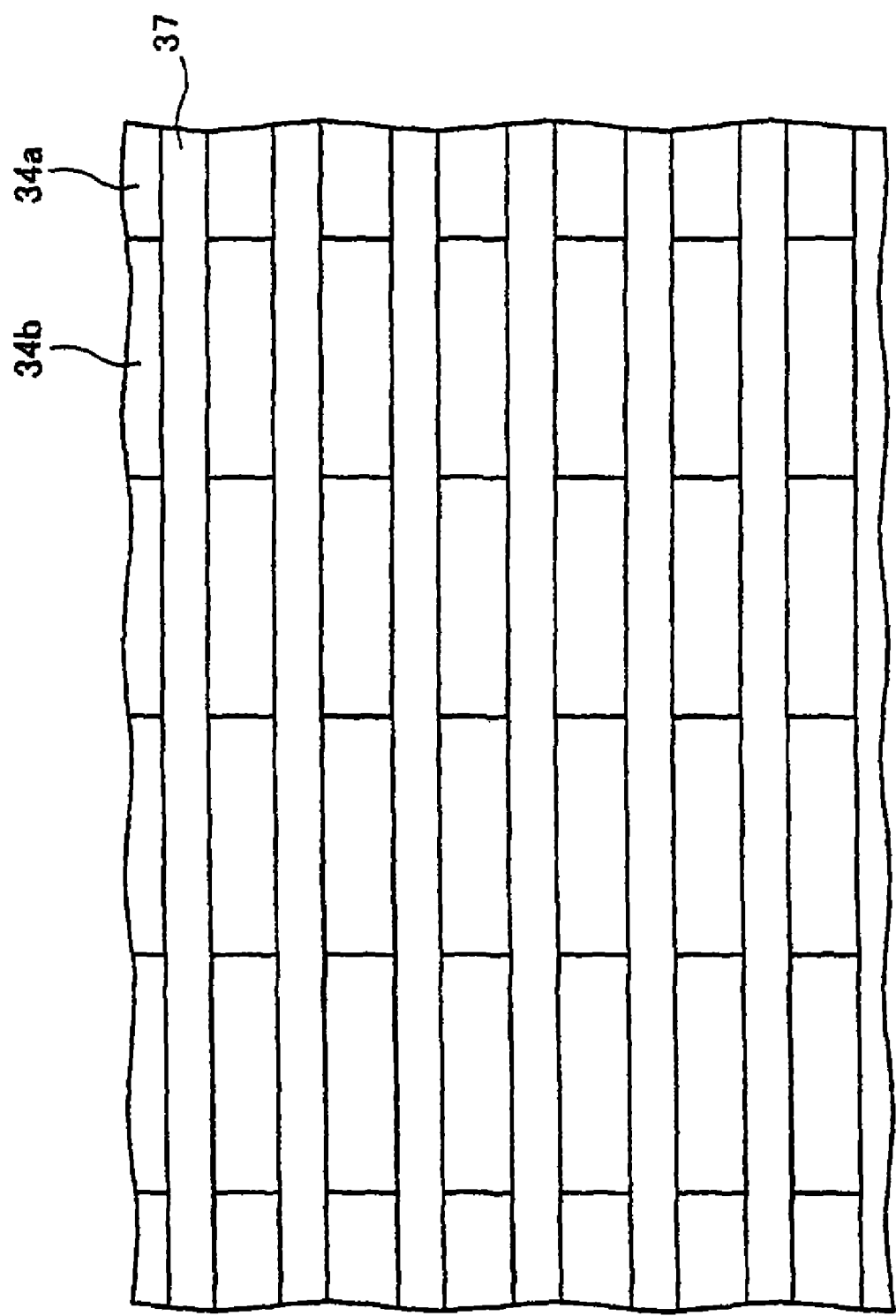
FIG. 2 is a top plan view showing the other structure of the semiconductor device according to the first mode for carrying out the invention.

FIG. 2 is a top plan view showing the other structure of the semiconductor device according to the first mode for carrying out the invention. In the structure shown in FIG. 1, LDN layers 34a and XLDN layers 34b are extended in perpendicular to the plane of paper. Trenches 37 having a trench gate structure are extended in perpendicular to the plane of paper. In other words, LDN layers 34a and XLDN layers 34b are extended in parallel to trenches 37. Alternatively, the extending direction of LDN layers 34a and XLDN layers 34b and the extending direction of trenches 37 may cross at any angle between the 90 degrees of angle and the 45 degrees of angle.

Figure 3:
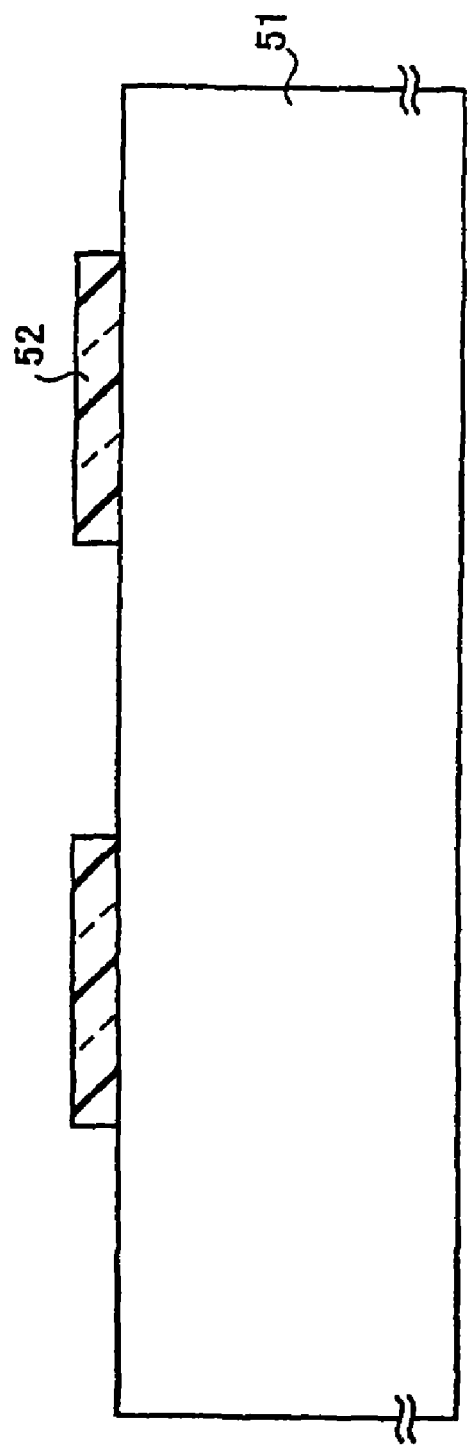
FIG. 3 is a cross sectional view describing an initial step for manufacturing the semiconductor device according to the first mode for carrying out the invention.
Figure 4:
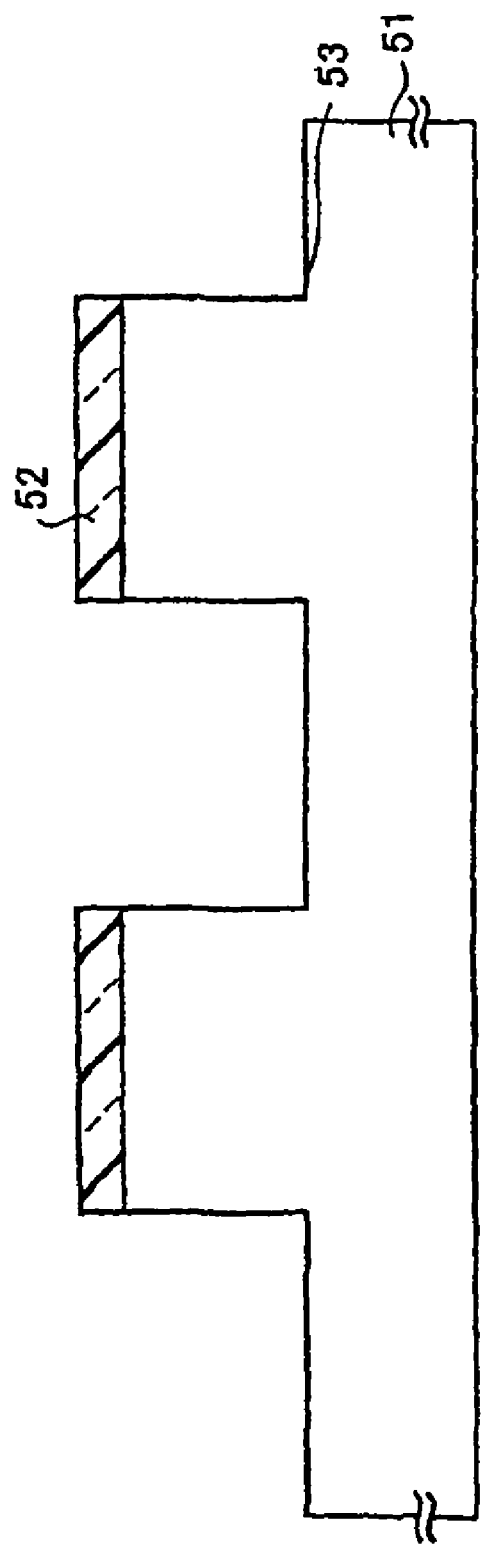
FIG. 4 is a cross sectional view describing the manufacturing step subsequent to the step described in FIG. 3.

FIGS. 3 through 6 are cross sectional views describing the manufacturing method for manufacturing the semiconductor device according to the first mode for carrying out the invention. Referring at first to FIG. 3, n-type semiconductor substrate 51 is prepared for a starting substrate. Oxide film 52 is formed on the first major surface of n-type semiconductor substrate 51. Some portions of oxide film 52 are removed by photolithography and etching to expose some portions of n-type semiconductor substrate 51. For example, oxide film 52 is left in a stripe pattern and the first major surface of n-type semiconductor substrate 51 is exposed in a stripe pattern. Then, anisotropic etching such as reactive ion etching (hereinafter referred to as "RIE") is conducted to form deep trenches 53 in n-type semiconductor substrate 51 as shown in FIG. 4.

Figure 5:
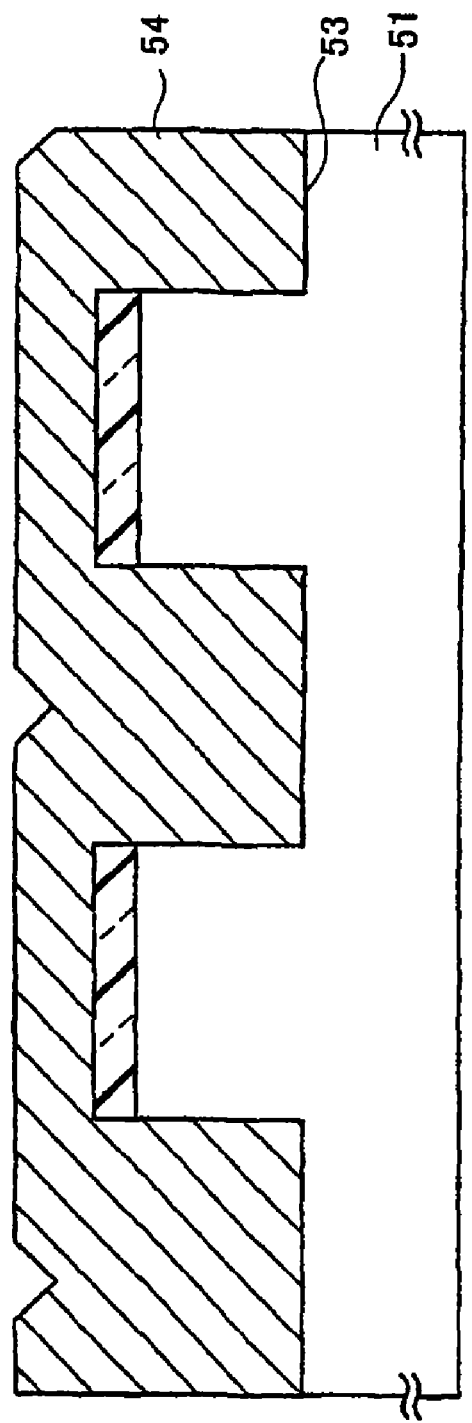
FIG. 5 is a cross sectional view describing the manufacturing step subsequent to the step described in FIG. 4.
Figure 6:
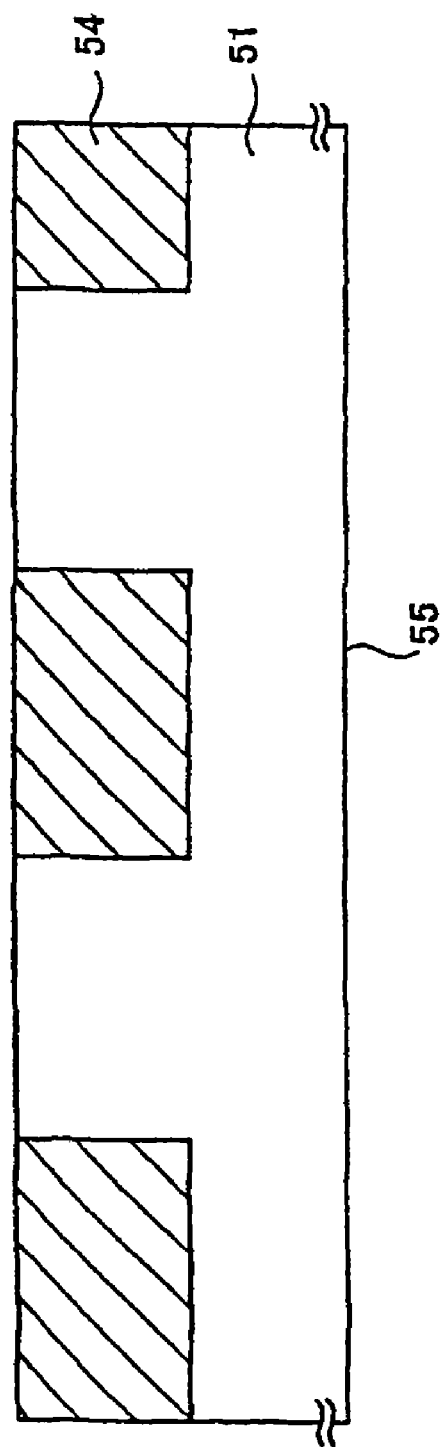
FIG. 6 is a cross sectional view describing the manufacturing step subsequent to the step described in FIG. 5.

Then, epitaxial growth is conducted to fill trenches 53 with semiconductor 54 without leaving any gap as shown in FIG. 5. In the epitaxial growth, n-type semiconductor 54, the impurity concentration thereof is different from the impurity concentration in n-type semiconductor substrate 51, is grown. Then, polishing such as chemical mechanical polishing (hereinafter referred to as "CMP") is conducted to remove semiconductor 54 grown over oxide film 52, to flatten the polished surface and to further remove oxide film 52 as shown in FIG. 6. Semiconductor substrate 55 prepared as described above is employed for the substrate for manufacturing the semiconductor device according to the first mode for carrying out the invention. (Hereinafter the substrate for manufacturing will be referred to as the "manufacturing substrate".)

When trenches 53 in the manufacturing substrate (semiconductor substrate 55) are filled with semiconductor 54 doped more heavily than the starting substrate (semiconductor substrate 51), the epitaxial growth layer (semiconductor 54) provides LDN layer 43a and the starting substrate provides XLDN layer 43b. When trenches 53 in the manufacturing substrate (semiconductor substrate 55) are filled with semiconductor 54 doped more lightly than the starting substrate (semiconductor substrate 51), the epitaxial growth layer (semiconductor 54) provides XLDN layer 43b and the starting substrate provides LDN layer 43a.

Then, although not illustrated, a surface structure including p-type channel layer 32, $n^+$-type emitter region 36, trench 37, gate insulator film 38, gate electrode 39, interlayer insulator film 40, emitter electrode 41, and $p^+$-type body region 42 is formed on the first major surface side of the manufacturing substrate (semiconductor substrate 55) by the method well known to the persons skilled in the art. Semiconductor substrate 55 is polished and etched from the second major surface side thereof to thin semiconductor substrate 55. Then, field stop layer 35 and p-type collector layer 33 are formed on the second major surface side of semiconductor substrate 55 by ion implantation and by the subsequent heat treatment. Then, collector electrode 43 is formed on p-type collector layer 33. If necessary, the first major surface side is covered with a passivation film.

The method for manufacturing the manufacturing substrate (semiconductor substrate 55) from the starting substrate (semiconductor substrate 51) resembles the method for manufacturing a conventional semiconductor substrate having a super-junction structure. The semiconductor substrate having a super-junction structure includes an alternating conductivity type layer including n-type semiconductor layers and p-type semiconductor layers arranged alternately and repeatedly. Therefore, the manufacturing substrate (semiconductor substrate 55) is obtained by arranging lightly doped semiconductor layers and extremely lightly doped semiconductor layers alternately by employing any of the various techniques known to the persons skilled in the art for manufacturing a semiconductor substrate having a super-junction structure. The lightly doped semiconductor layer and the extremely lightly doped semiconductor layer exhibit the same conductivity type. However, the impurity concentrations therein are different. For example, a thin semiconductor layer is grown epitaxially on the first major surface of a starting substrate and an impurity is implanted into some portions of the epitaxial growth layer so that impurity concentration variations may be caused in the epitaxial growth layer and along the major surface thereof. The operations described above are repeated so that lightly doped semiconductor layers and extremely lightly doped semiconductor layers, the conductivity types thereof are the same but the impurity concentrations thereof are different, may be arranged alternately.

A trench-gate IGBT of the 1200 V class is manufactured exemplary by the manufacturing method according to the first mode for carrying out the invention. The turnoff waveform, the breakdown voltage characteristics, and the I-V characteristics thereof are measured. An n-type floating-zone silicon substrate cut out from a silicon ingot prepared by the floating zone method (hereinafter referred to as the "FZ method") is used for a starting substrate. (Hereinafter the floating-zone silicon substrate will be referred to as the "FZ silicon substrate".) The resistivity of the FZ silicon substrate is 100Ω cm. The thickness of the FZ silicon substrate is 500 μm. The orientation of the plane of the FZ silicon substrate is (100), while the direction of orientation flat of the FZ silicon substrate is <100>.

An oxide film of 3 μm in thickness is formed, for example, by a thermal oxidation treatment on the first major surface of the FZ silicon substrate. Then, the oxide film is removed by the photolithographic and etching techniques for a width of 10 μm and with spaces of 10 μm to expose the first major surface of the FZ silicon substrate in a stripe pattern. Then, the silicon layer is removed in rectangular shapes to the depth of around 100 μm by anisotropic etching such as RIE using the remaining oxide film for a mask to form stripe-shaped deep trenches in the FZ silicon substrate. The portions of the FZ silicon substrate between the trenches provide XLDN layers.

Then, epitaxial growth is conducted to bury the trenches in the FZ silicon substrate with an n-type semiconductor, the resistivity thereof is 50Ω cm. The epitaxial growth layers provide LDN layers. Then, polishing such as CMP is conducted to remove the epitaxial growth layer grown over the mask oxide film and the polished plane is flattened. Thus, a manufacturing substrate for manufacturing a semiconductor device is obtained. An IGBT having the structure shown in FIG. 1 is manufactured using the manufacturing substrate obtained as described above. After forming the emitter side structure (surface structure) of the IGBT, the substrate is polished and etched from the back surface side thereof to thin the substrate to be around 120 μm in thickness. This substrate thickness is the thickness of the n-type main semiconductor layer. Then, the collector side structure (back surface structure) of the IGBT is formed. The emitter side surface is covered with a polyimide film.

Figure 20:
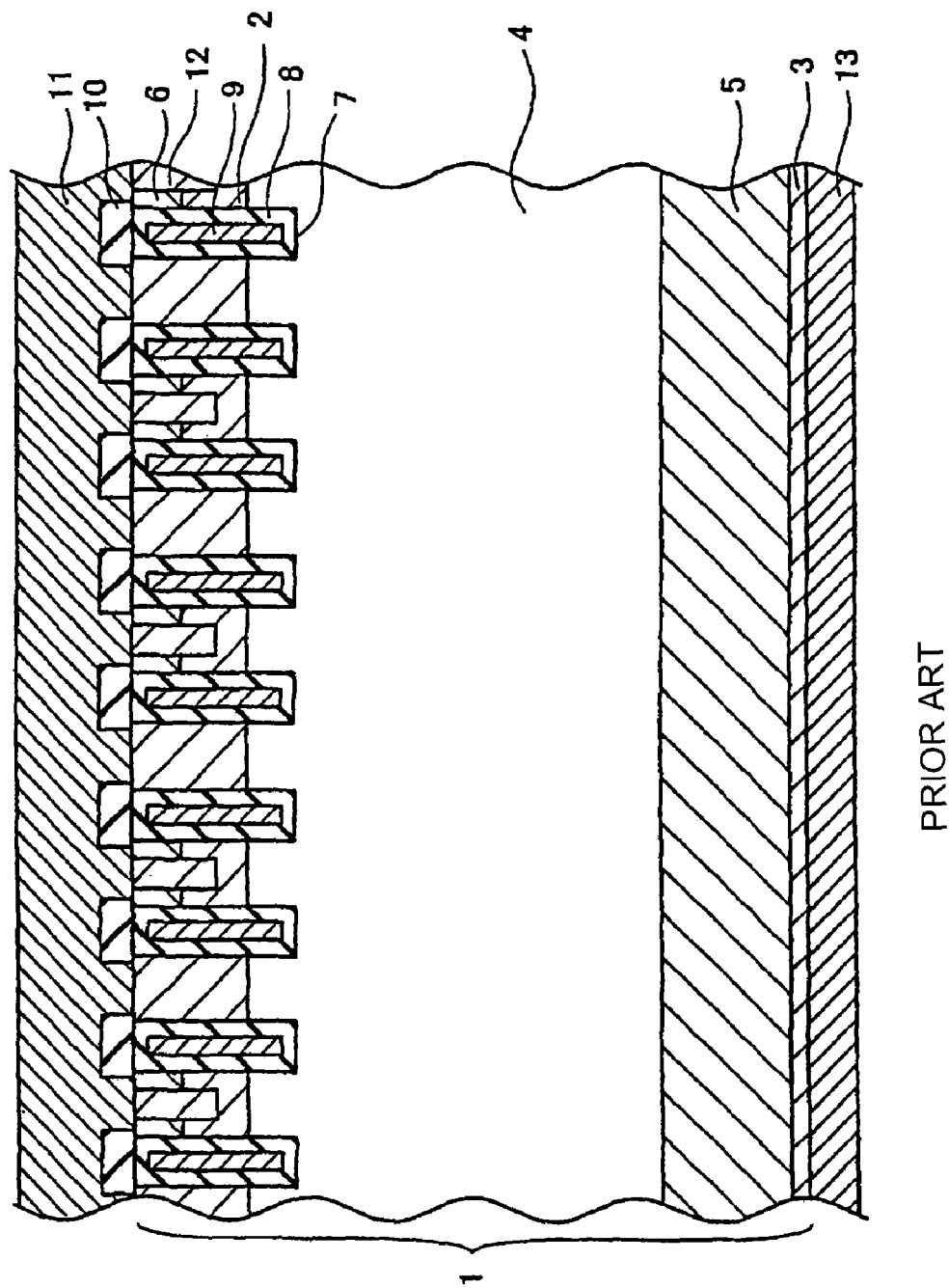
FIG. 20 is a cross sectional view showing the structure of a conventional trench-gate IGBT.

An IGBT according to a first embodiment (hereinafter referred to as a "first IGBT") having the cross sectional structure shown in FIG. 1 is manufactured as described above. An IGBT according to a second embodiment (hereinafter referred to as a "second IGBT") having the planar structure shown in FIG. 2 is manufactured in the same manner as the first IGBT. In the first and second IGBT's, the resistivity of the LDN layer is 50Ω cm and the resistivity of the XLDN layer is 100Ω cm. In the first and second IGBT's, the n-type main semiconductor layer is 120 μm in thickness. In an IGBT according to a third embodiment (hereinafter referred to as a "third IGBT"), the resistivity of the LDN layer is 35Ω cm and the resistivity of the XLDN layer is 500Ω cm. The third IGBT includes an n-type main semiconductor layer of around 110

μm in thickness. In an IGBT according to a comparative example 1 (hereinafter referred to as a "comparative IGBT 1") having the conventional structure shown in FIG. 20, the resistivity of the n-type base layer is 50Ω cm and the thickness of the n-type main semiconductor layer is 120 μm.

Figure 7:
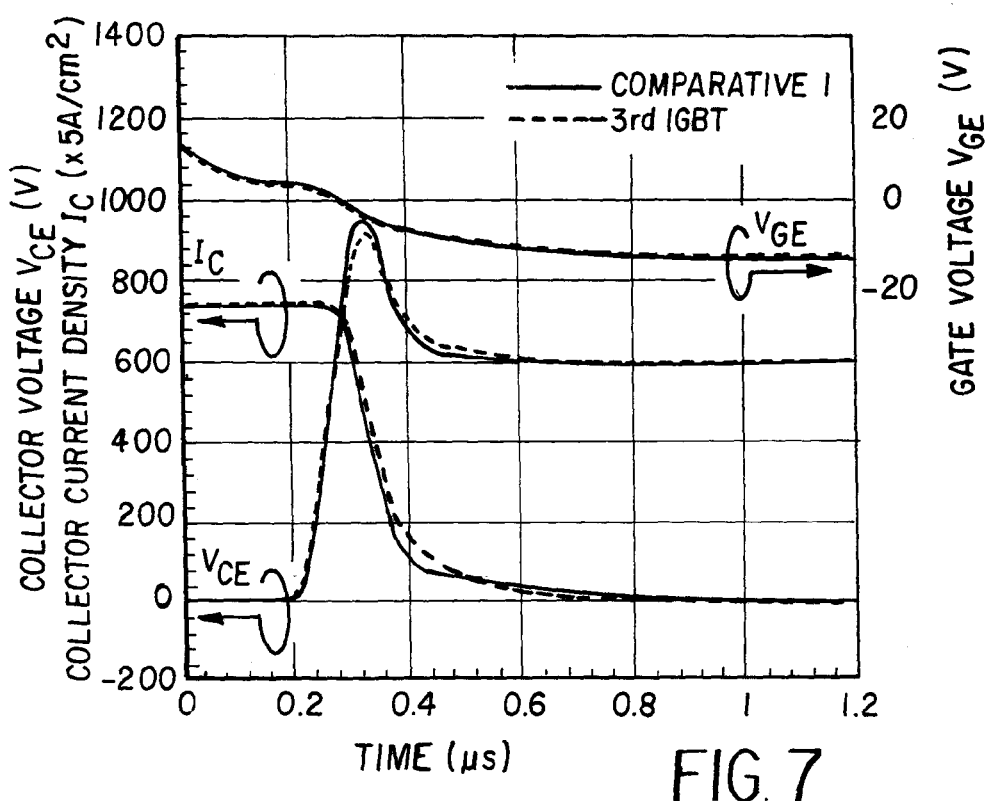
FIG. 7 is a graph showing a set of curves for comparing the turnoff waveforms of an IGBT according to a first embodiment and an IGBT according to a comparative example 1.
Figure 8:
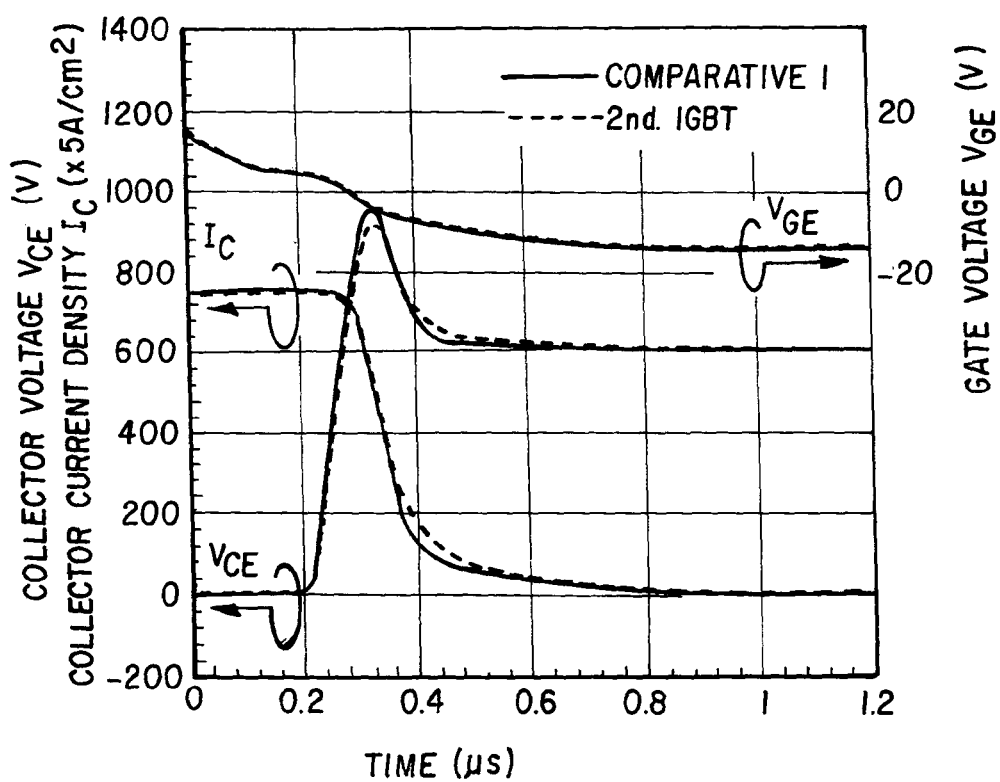
FIG. 8 is a graph showing a set of curves for comparing the turnoff waveforms of an IGBT according to a second embodiment and the IGBT according to the comparative example 1.
Figure 9:
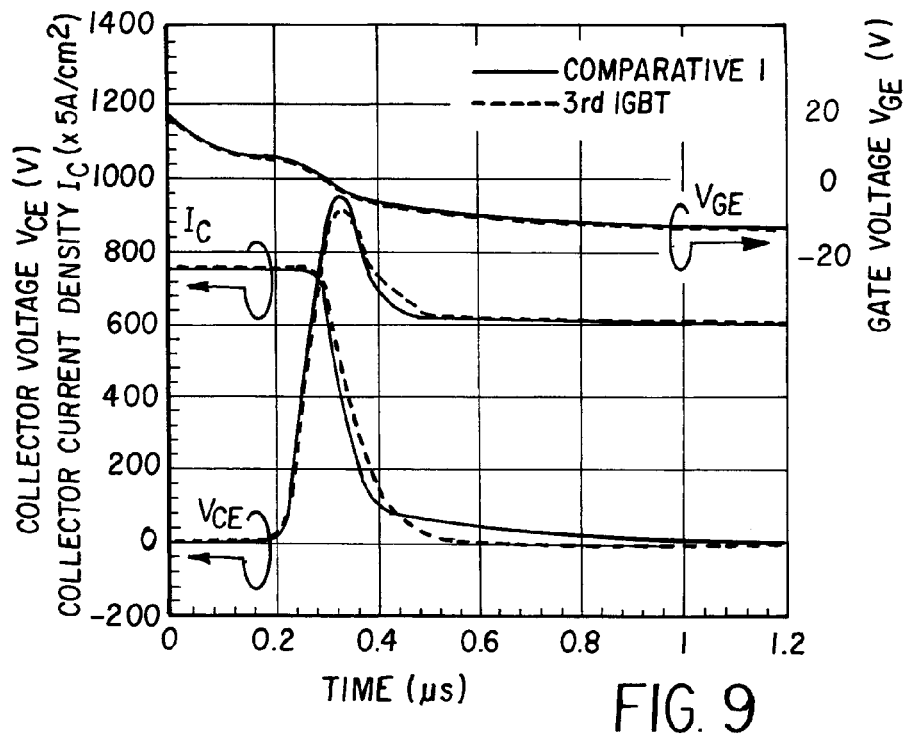
FIG. 9 is a graph showing a set of curves for comparing the turnoff waveforms of an IGBT according to a third embodiment and the IGBT according to the comparative example 1.

FIG. 7 is a graph showing a set of curves for comparing the turnoff waveforms of the first IGBT and the comparative IGBT 1. FIG. 8 is a graph showing a set of curves for comparing the turnoff waveforms of the second IGBT and the comparative IGBT 1. FIG. 9 is a graph showing a set of curves for comparing the turnoff waveforms of the third IGBT and the comparative IGBT 1. As these figures indicate, the turnoff current waveforms of the first through third IGBT's change more slowly in the early stage of falling thereof than the turnoff current waveform of the comparative IGBT 1 in the early stage of falling thereof. The currents after the decrease thereof, the so-called tail currents, of the first through third IGBT's decrease to 0 more quickly than the tail current of the comparative IGBT 1. The first through third IGBT's cause the turnoff loss almost the same with the turnoff loss that the comparative IGBT 1 causes. However, the first through third IGBT's suppress the collector voltage rise and quicken the overall turnoff. In other words, the first through third IGBT's realize high-speed turnoff and soft switching at the same time.

The first and second IGBT's exhibit almost the same effects. Therefore, it is obvious that the arrangement pattern of the LDN layer and the XLDN layer is irrelevant to the arrangement pattern of the surface structure including the gate electrode structure and $n^+$-type emitter region. The time, that elapses from the OFF-signal feed to the gate to the decrease of the tail current to 0 and that is read out from the graphs, is 0.8 μs for the first and second IGBT's and 0.6 μs for the third IGBT. Thus, the tail current in the third IGBT decreases to 0 ore quickly than the tail currents in the first and second IGBT's. By virtue of the higher-speed switching, the third IGBT causes the turnoff loss lower than the turnoff losses, which the first and second IGBT's and the comparative IGBT 1 cause, by 8%.

Figure 10:
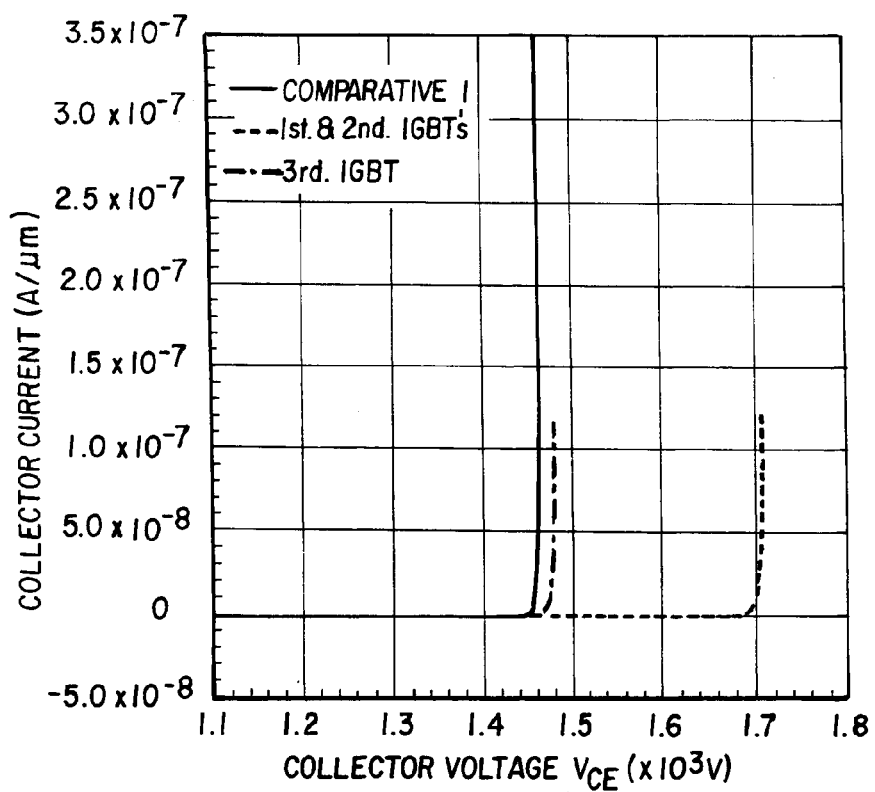
FIG. 10 is a graph relating the collector current and the collector voltage for the IGBT's according to the first through third embodiments and the IGBT according to the comparative example 1 for comparing the breakdown voltage characteristics thereof.

FIG. 10 is a graph relating the collector current and the collector voltage for the first through third IGBT's and the comparative IGBT 1 for comparing the breakdown voltage characteristics thereof. As FIG. 10 indicates, the breakdown voltage of the third IGBT is lower than the breakdown voltages of the first and second IGBT's due to the following reasons. The resistivity of the LDN layer in the third IGBT is lower than the resistivity of the LDN layer in the first and second IGBT's. The n-type main semiconductor layer in the third IGBT is thinner than the n-type main semiconductor layers in the first and second IGBT's. However, it is obvious that the third IGBT, in which LDN layers and XLDN layers constitute an n-type main semiconductor layer, facilitates securing a breakdown voltage almost equivalent to the breakdown voltage of the comparative IGBT 1.

The breakdown voltages of the first and second IGBT's are higher than the breakdown voltage of the comparative IGBT 1 as far as the n-type main semiconductor layers thereof are as thick as the n-type main semiconductor layer in the comparative IGBT 1. If it is enough to secure a breakdown voltage equivalent to the breakdown voltage of the comparative IGBT 1, the other characteristics may be improved by appropriately changing the structure, for example, by thinning the n-type main semiconductor layer as in the third IGBT. Therefore, the freedom for designing an IGBT is improved.

Figure 11:
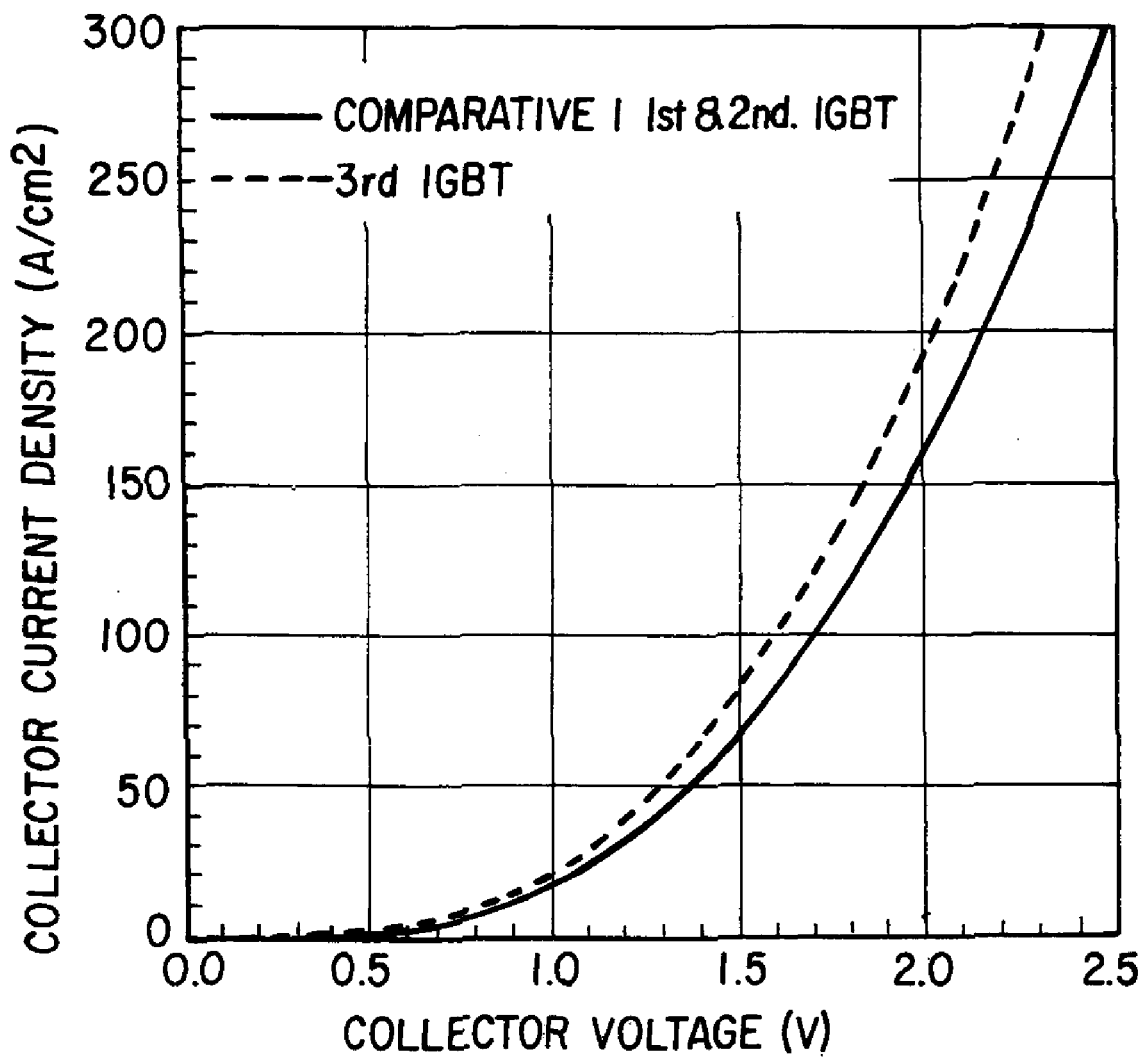
FIG. 11 is a graph relating the collector current density and the collector voltage for comparing the I-V characteristics of the IGBT's according to the first through third embodiments and the IGBT according to the comparative example 1.

FIG. 11 is a graph relating the collector current density and the collector voltage for comparing the I-V characteristics of the first through third IGBT's and the comparative IGBT 1.

As FIG. 11 indicates, the ON-state voltage of the third IGBT is lower than the ON-state voltages of the first and second IGBT's and the comparative IGBT 1. The n-type main semiconductor layer in the third IGBT is thinner than the n-type main semiconductor layers in the first and second IGBT's and the comparative IGBT 1. In other words, the third IGBT improves the ON-state-voltage turnoff-power-loss tradeoff characteristics.

Figure 12:
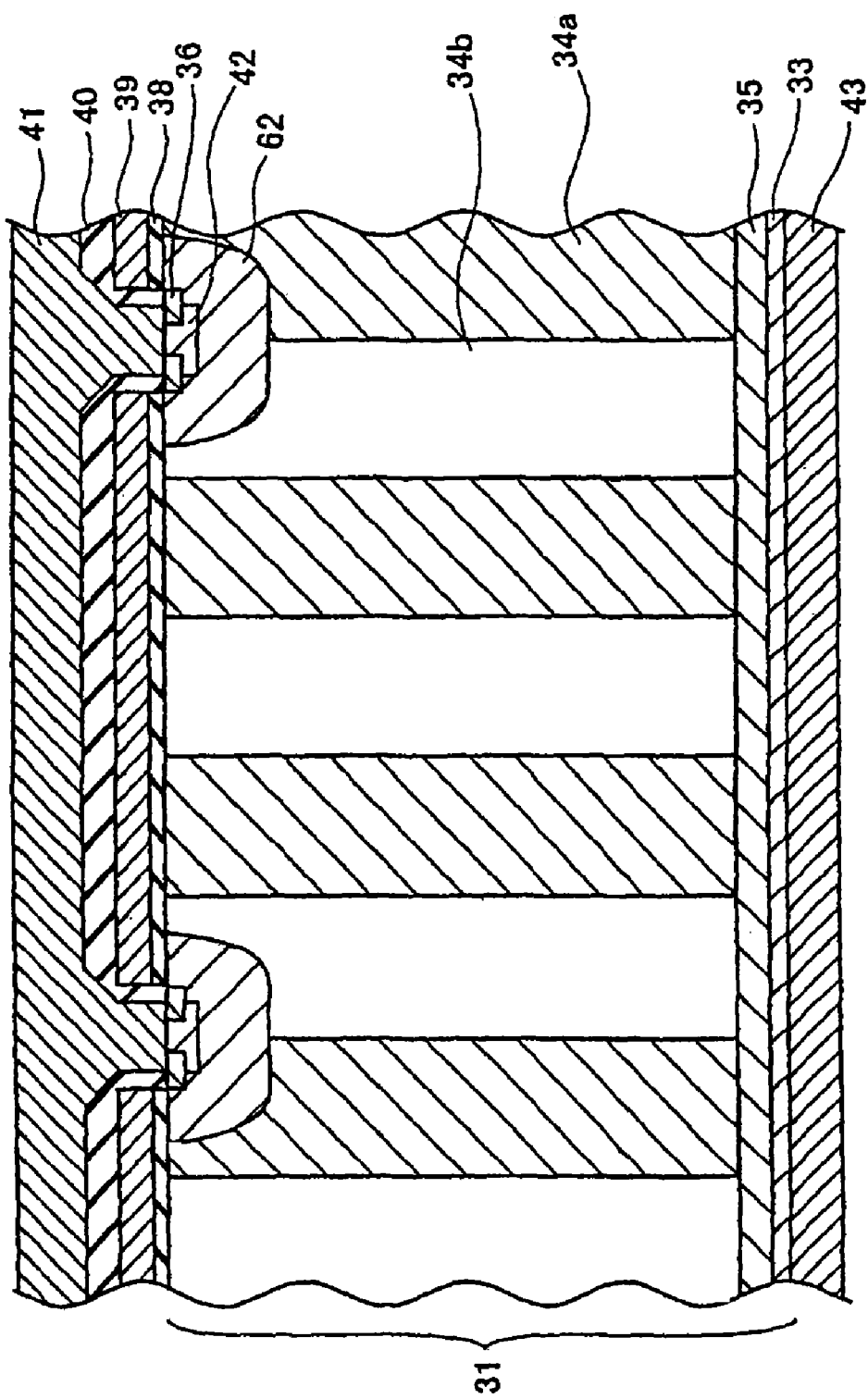
FIG. 12 is a cross sectional view showing the structure of a semiconductor device according to a second mode for carrying out the invention.

FIG. 12 is a cross sectional view showing the structure of a semiconductor device according to a second mode for carrying out the invention. As shown in FIG. 12, the semiconductor device according to the second mode for carrying out the invention is a planar-gate IGBT. In n-type main semiconductor layer 31, lightly doped n-type semiconductor layer (hereinafter referred to as "LDN layer") 34a and extremely lightly doped n-type semiconductor layer (hereinafter referred to as "XLDN layer") 34b are arranged alternately and repeatedly. LDN layer 34a and XLDN layer 34b are shaped, for example, with respective stripes extending along the first major surface of n-type main semiconductor layer 31. In the surface portion on the first major surface side of n-type main semiconductor layer 31, p-type channel region 62 is formed selectively.

In the surface portion of p-type channel region 62, $n^+$-type emitter region 36 and $p^+$-type body region 42 are formed selectively. Gate insulator film 38 is disposed along the surface of p-type channel region 62 between $n^+$-type emitter region 36 and LDN layer 34a or XLDN layer 34b. Gate electrode 39 is on gate insulator film 38. Gate electrode 39 and the other regions in n-type main semiconductor layer 31 except p-type channel region 62 are insulated from each other by the insulator film extending from gate insulator film 38. The other structures are the same with the structures in the trench-gate IGBT shown in FIG. 1.

Since high-speed turnoff and soft switching are sufficiently obtained at the same time, it is preferable for the ratio of the impurity concentration in LDN layer 34a and the impurity concentration in XLDN layer 34b to be equal to or more than 2. Since the arrangement pattern of LDN layers 34a and XLDN layers 34b does not depend on the arrangement pattern of the IGBT surface structure, the impurity concentration distribution in n-type main semiconductor layer 31 can be designed freely and independently of the arrangement pattern of the IGBT surface structure. In the structure shown in FIG. 12, the extending direction of LDN layers 34a and XLDN layers 34b and the extending direction of p-type channel region 62 are parallel to each other. Alternatively, the extending direction of LDN layers 34a and XLDN layers 34b and the extending direction of p-type channel region 62 may cross at any angle between the 90 degrees of angle and the 45 degrees of angle.

Figure 13:
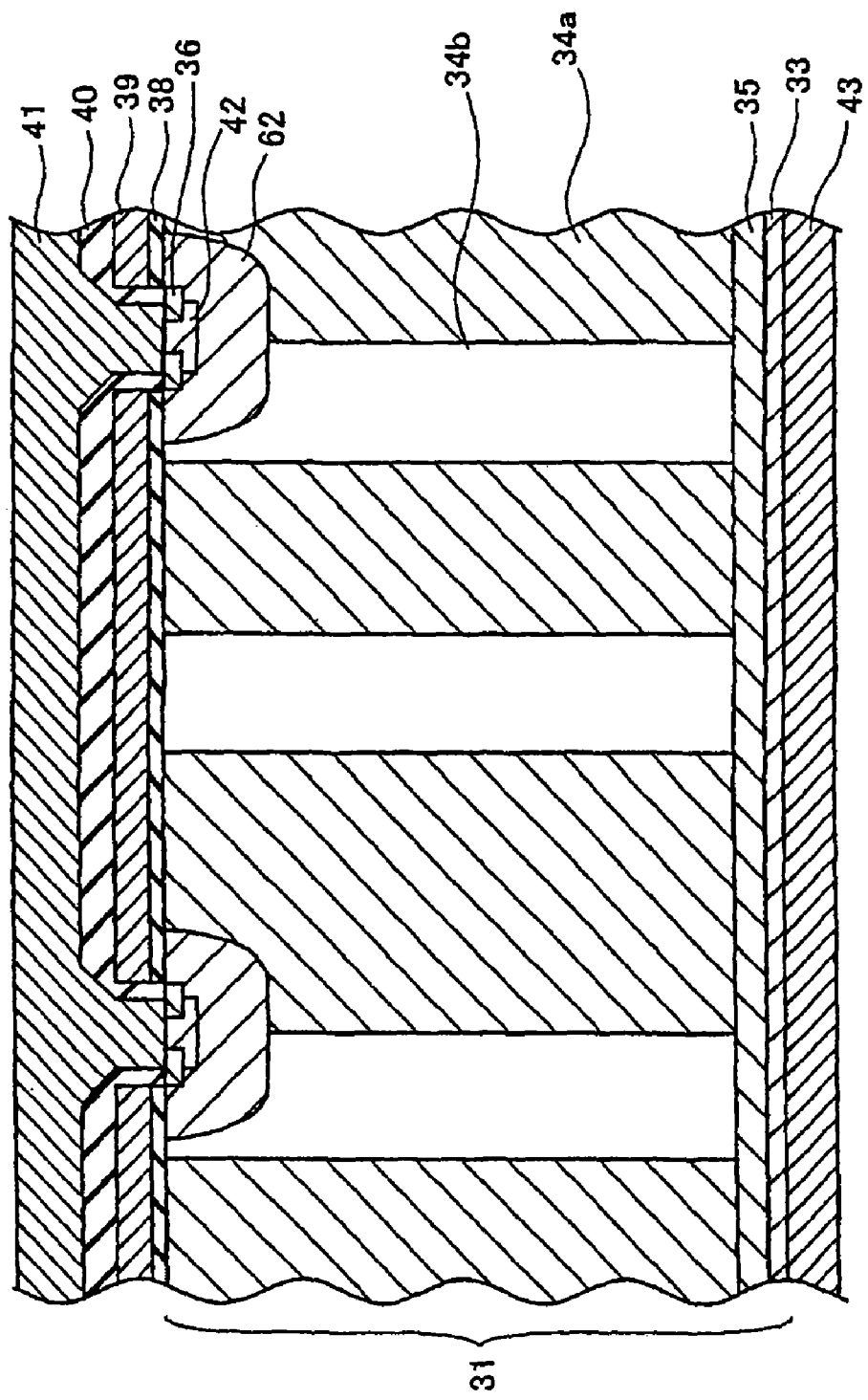
FIG. 13 is a cross sectional view showing the other structure of the semiconductor device according to the second mode for carrying out the invention.

FIG. 13 is a cross sectional view showing the other structure of the semiconductor device according to the second mode for carrying out the invention. In the structure shown in FIG. 12, LDN layers 34a have the same width and XLDN layers 34b have the same width. And, LDN layer 34a and XLDN layer 34b have the same width in the structure shown in FIG. 12. In other words, the pitch, at which LDN layer 34a and XLDN layer 34b are repeated, is unchanged. In contrast, the width of LDN layers 34a may be indefinite with no problem and the width of XLDN layers 34b may be indefinite with no problem in the structure shown in FIG. 13. In other words, the pitch, at which LDN layer 34a and XLDN layer 34b are repeated, may be indefinite with no problem.

In the method for manufacturing the semiconductor device according to the second mode for carrying out the invention, a manufacturing substrate for manufacturing is manufactured from a starting substrate in the same manner as in the method for manufacturing the semiconductor device according to the first mode for carrying out the invention. The method for manufacturing a planar-gate IGBT employing a manufacturing substrate is the same with the conventional manufacturing method.

A planar-gate IGBT of the 1200 V class is manufactured exemplary by the manufacturing method according to the second mode for carrying out the invention. The turnoff waveform, the breakdown voltage characteristics, and the I-V characteristics thereof are measured. An n-type floating-zone silicon substrate (hereinafter referred to as an "FZ silicon substrate") is used for the starting substrate. The resistivity of the FZ silicon substrate is 500Ω cm. The thickness of the FZ silicon substrate is 500 μm. The orientation of the plane of the FZ silicon substrate is (100). The direction of orientation flat of the FZ silicon substrate is <100>.

An oxide film of 3 μm in thickness is formed, for example, by a thermal oxidation treatment on the first major surface of the FZ silicon substrate. Then, the oxide film is removed for a width of 20 μm and with spaces of 20 μm to expose the first major surface of the FZ silicon substrate in a stripe pattern. Then, the silicon layer is removed in rectangular shapes to the depth of around 140 μm by anisotropic etching such as RIE using the remaining oxide film for a mask to form stripe-shaped deep trenches in the FZ silicon substrate. The portions of the FZ silicon substrate between the trenches provide XLDN layers.

Then, epitaxial growth is conducted to bury the trenches with an n-type semiconductor, the resistivity thereof is 500 cm. The epitaxial growth layers provide LDN layers. Then, polishing such as CMP is conducted to remove the epitaxial layer grown over the mask oxide film and the polished plane is flattened. Thus, a manufacturing substrate for manufacturing a semiconductor device is obtained. An IGBT having the structure shown in FIG. 12 is manufactured using the manufacturing substrate obtained as described above. After forming the emitter side structure (surface structure) of the IGBT, the substrate is polished and etched from the back surface side thereof to thin the substrate to be around 135 μm in thickness. This substrate thickness is the thickness of the n-type main semiconductor layer. Then, the collector side structure (back surface structure) of the IGBT is formed. The emitter side surface is covered with a polyimide film.

Figure 21:
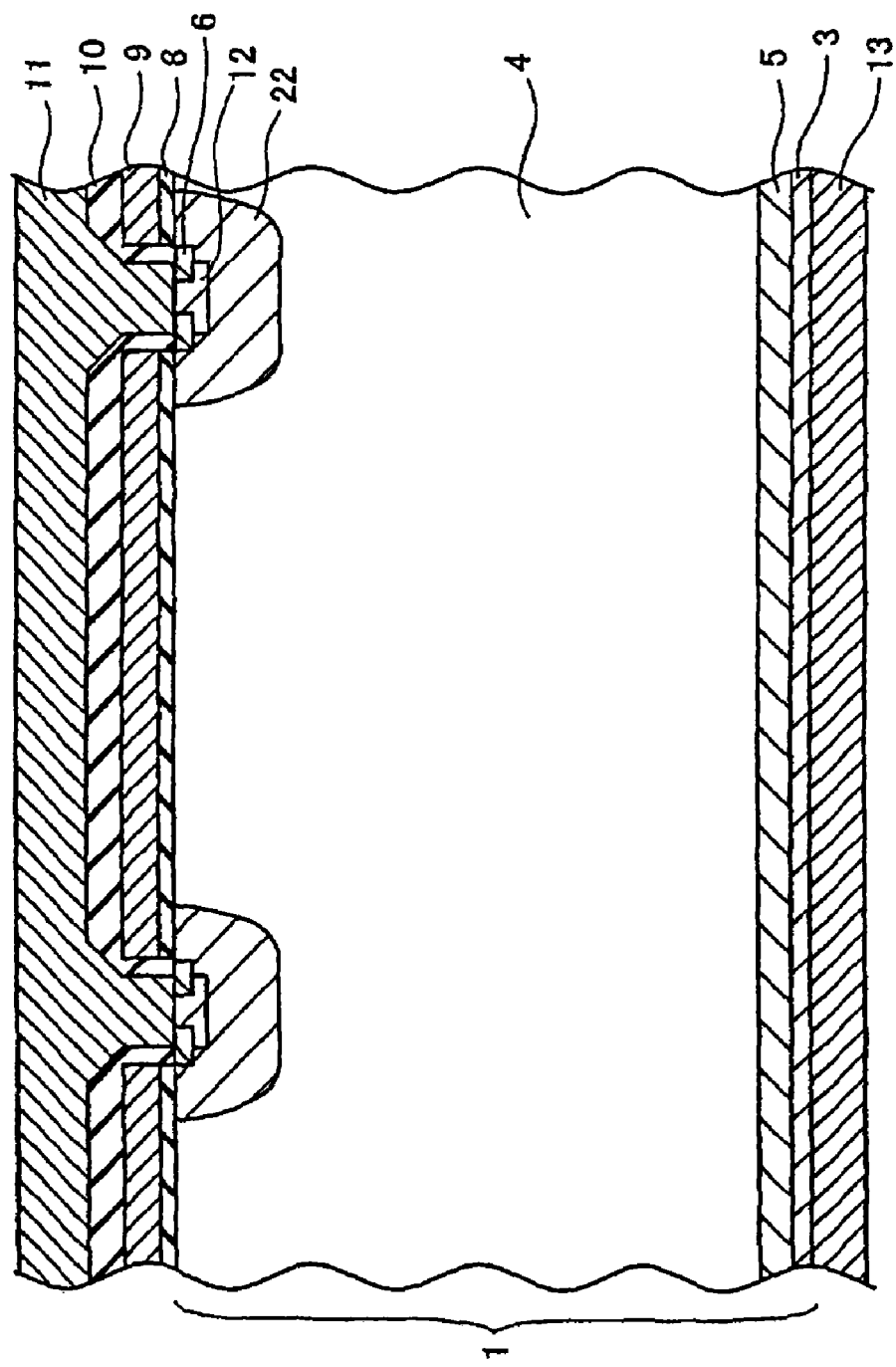
FIG. 21 is a cross sectional view showing the structure of a conventional planar-gate IGBT.

An IGBT according to a fourth embodiment (hereinafter referred to as a "fourth IGBT") having the cross sectional structure shown in FIG. 12 is manufactured as described above. An IGBT according to a fifth embodiment (hereinafter referred to as a "fifth IGBT") having the cross sectional structure shown in FIG. 13 is manufactured in the same manner as the fourth IGBT. In the fifth IGBT, the resistivity of the LDN layer is 70Ω cm. In manufacturing the fifth IGBT, the mask oxide film on the first major surface of the starting substrate is removed for indefinite widths and with indefinite spaces to conduct trench etching. An IGBT according to a sixth embodiment (hereinafter referred to as a "sixth IGBT") having the same structure same with that of the fifth IGBT includes an n-type main semiconductor layer of 125 μm in thickness. For the sake of comparison, an IGBT according to a comparative example 2 (hereinafter referred to as a "comparative IGBT 2") having the conventional structure shown in FIG. 21 is manufactured. In the comparative IGBT 2, the resistivity of the n-type base layer is 70Ω cm and the thickness of the n-type main semiconductor layer is 135 μm.

Figure 14:
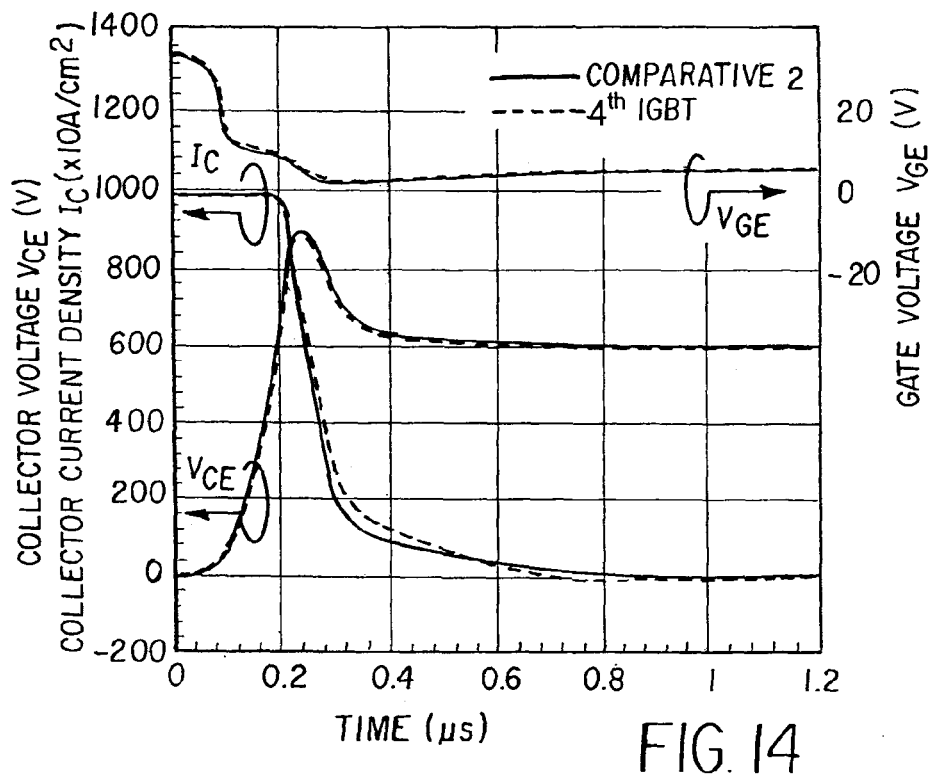
FIG. 14 is a graph showing a set of curves for comparing the turnoff waveforms of an IGBT according to a fourth embodiment and an IGBT according to a comparative example 2.
Figure 15:
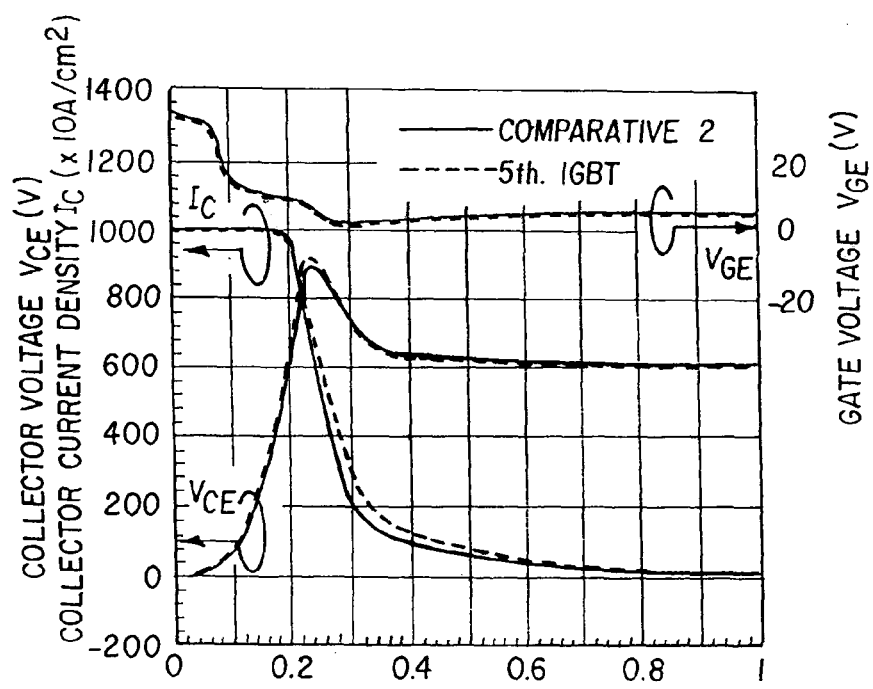
FIG. 15 is a graph showing a set of curves for comparing the turnoff waveforms of an IGBT according to a fifth embodiment and the IGBT according to the comparative example 2.
Figure 16:
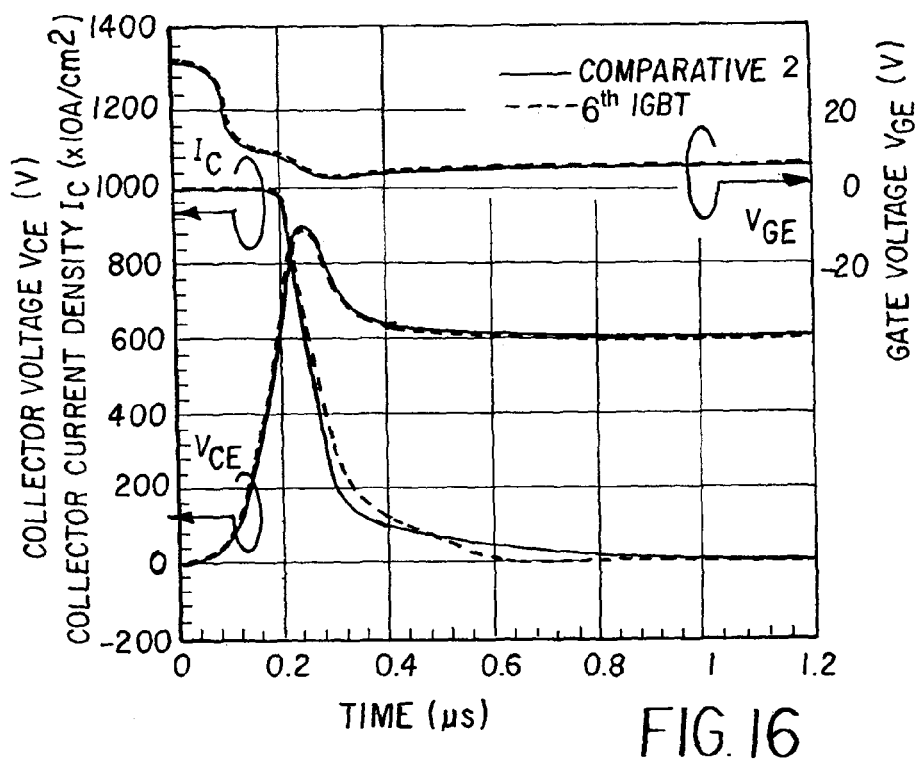
FIG. 16 is a graph showing a set of curves for comparing the turnoff waveforms of an IGBT according to a sixth embodiment and the IGBT according to the comparative example 2.

FIG. 14 is a graph showing a set of curves for comparing the turnoff waveforms of the fourth IGBT and the comparative IGBT 2. FIG. 15 is a graph showing a set of curves for comparing the turnoff waveforms of the fifth IGBT and the comparative IGBT 2. FIG. 16 is a graph showing a set of curves for comparing the turnoff waveforms of the sixth IGBT and the comparative IGBT 2. As these figures indicate, the turnoff current waveforms of the fourth through sixth IGBT's change more slowly in the early stage of falling thereof than the turnoff current waveform of the comparative IGBT 2 in the early stage of falling thereof. The currents after the decrease thereof, the so-called tail currents, of the fourth through sixth IGBT's decrease to 0 more quickly than the tail current of the comparative IGBT 2. The fourth through sixth IGBT's cause the turnoff loss almost the same with the turnoff loss that the comparative IGBT 2 causes. However, the fourth through sixth IGBT's suppress the collector voltage rise and quicken the overall turnoff. In other words, the fourth through sixth IGBT's realize high-speed turnoff and soft switching at the same time.

The fourth and fifth IGBT's exhibit almost the same effects. Therefore, it is obvious that the arrangement pattern of the LDN layer and the XLDN layer is irrelevant to the arrangement pattern of the surface structure including the gate electrode structure and n$^+$-type emitter region. It is also obvious that the same effects will be obtained, even if the unit structure including an LDN layer and an XLDN layer is disordered. The time, that elapses from the OFF-signal feed to the gate to the decrease of the tail current to 0 and that is read out from the graphs, is 0.7 μs for the fourth and fifth IGBT's and 0.6 μs for the sixth IGBT. Thus, the tail current in the sixth IGBT decreases to 0 more quickly than the tail currents in the fourth and fifth IGBT's. By virtue of the higher-speed switching, the sixth IGBT causes the turnoff loss lower than the turnoff losses, which the fourth and fifth IGBT's and the comparative IGBT 2 cause, by 8%.

Figure 17:
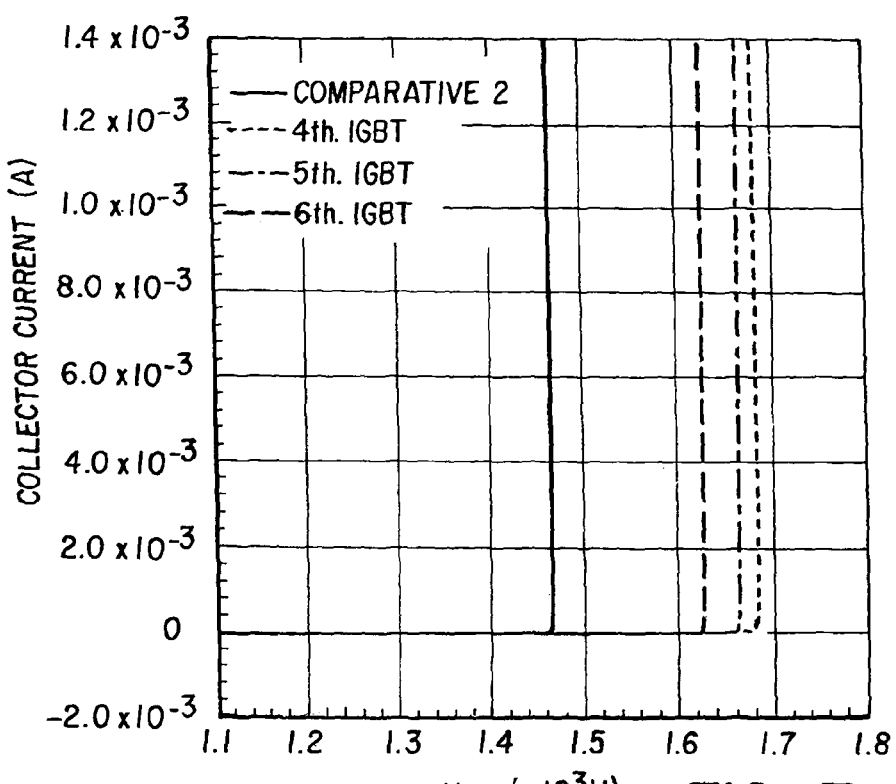
FIG. 17 is a graph relating the collector current and the collector voltage for the IGBT's according to the fourth through sixth embodiments and the IGBT according to the comparative example 2 for comparing the breakdown voltage characteristics thereof.

FIG. 17 is a graph relating the collector current and the collector voltage for the fourth through sixth IGBT's and the comparative IGBT 2 for comparing the breakdown voltage characteristics thereof. As FIG. 17 indicates, the breakdown voltage of the sixth IGBT is lower than the breakdown voltages of the fourth and fifth IGBT's, since the n-type main semiconductor layer in the sixth IGBT is thinner than the n-type main semiconductor layers in the fourth and fifth IGBT's by 10 μm. However, it is obvious that the sixth IGBT, in which LDN layers and XLDN layers constitute an n-type main semiconductor layer and the resistivity of the XLDN layer is set at high 500 Ωcm, facilitates securing a breakdown voltage higher than the breakdown voltage of the comparative IGBT 2.

The breakdown voltages of the fourth and fifth IGBT's are higher than the breakdown voltage of the comparative IGBT 2. If it is enough to secure a breakdown voltage equivalent to the breakdown voltage of the comparative IGBT 2, the other characteristics may be improved by appropriately changing the structure, for example, by thinning the n-type main semiconductor layer. Therefore, the freedom for designing an IGBT is improved.

Figure 18:
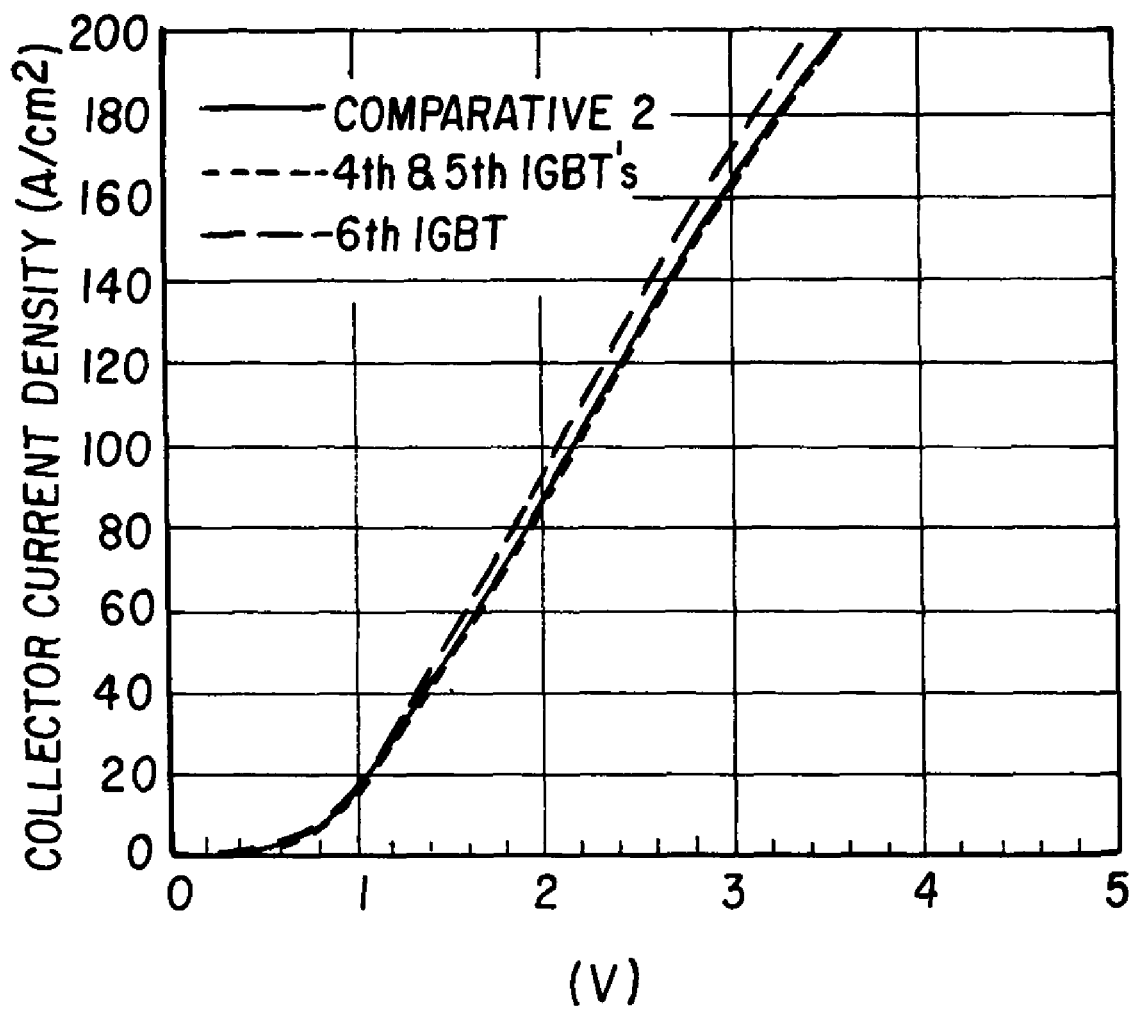
FIG. 18 is a graph relating the collector current density and the collector voltage for comparing the I-V characteristics of the IGBT's according to the fourth through sixth embodiments and the IGBT according to the comparative example 2.

FIG. 18 is a graph relating the collector current density and the collector voltage for comparing the I-V characteristics of the fourth through sixth IGBT's and the comparative IGBT 2. As FIG. 18 indicates, the ON-state voltage of the sixth IGBT is lower than the ON-state voltages of the fourth and fifth IGBT's and the comparative IGBT 2. The n-type main semiconductor layer in the sixth IGBT is thinner than the n-type main semiconductor layers in the fourth and fifth IGBT's and the comparative IGBT 2 by 10 μm. In other words, the sixth IGBT improves the ON-state-voltage turnoff-power-loss tradeoff characteristics.

Figure 19:
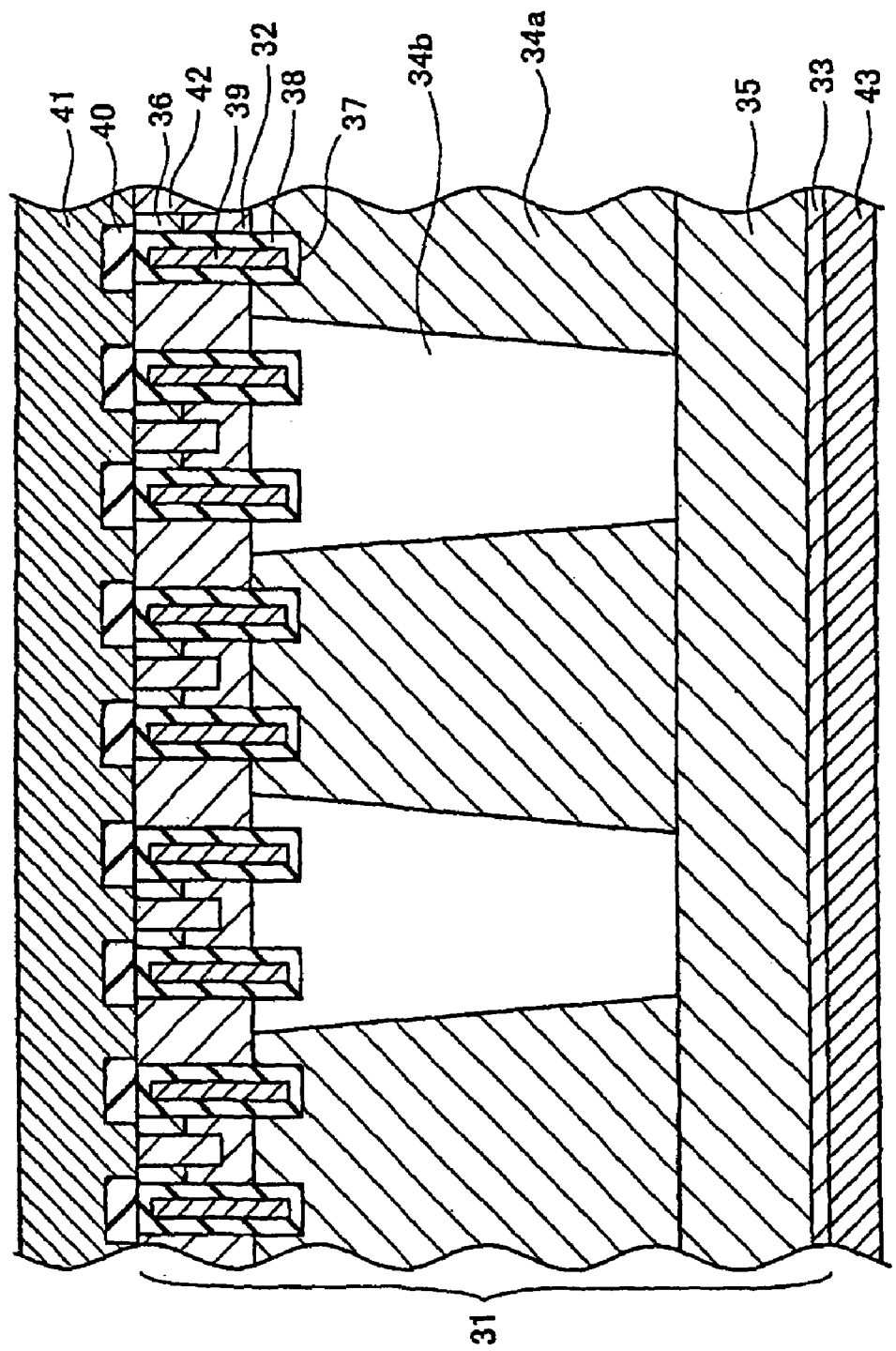
FIG. 19 is a cross sectional view of a semiconductor device according to a third mode for carrying out the invention.

FIG. 19 is a cross sectional view of a semiconductor device according to a third mode for carrying out the invention. In the semiconductor devices according to the first and second modes for carrying out the invention, the widths of lightly doped n-type semiconductor layer (hereinafter referred to as "LDN layer") 34a and extremely lightly doped n-type semiconductor layer (hereinafter referred to as "XLDN layer") 34b are unchanged from the emitter side to the collector side.

In the semiconductor device according to the third mode for carrying out the invention, LDN layers 34a are widened from the emitter side to the collector side but XLDN layers 34b are narrowed from the emitter side to the collector side as shown in FIG. 19. Even if the structure as described above is employed, the semiconductor device according to the third mode for carrying out the invention exhibits the effects same as the effects that the semiconductor devices according to the first and second modes for carrying out the invention exhibit. When XLDN layers 34b are widened from the emitter side to the collector side, space charge regions will reach the buffer layer (field stop layer 35) too fast as a high voltage is applied at the time of turnoff. Since voltage oscillations are liable to be caused, it is not preferable to widen XLDN layers 34b from the emitter side to the collector side.

The modes for carrying out the invention are not limited to those described above and changes and modifications are obvious to the persons skilled in art without departing from the true spirit of the invention. For example, it is not always necessary to shape the lightly doped semiconductor layers and the extremely lightly doped semiconductor layers in the main semiconductor layer with respective stripes as far as the lightly doped semiconductor layers and the extremely lightly doped semiconductor layers are arranged alternately and repeatedly. For example, the lightly doped semiconductor layers may be shaped with respective islands scattered throughout the extremely lightly doped semiconductor layer. Alternatively, the extremely lightly doped semiconductor layers may be shaped with respective islands scattered throughout the lightly doped semiconductor layer. In the main semiconductor layer, a set of three or more layers, the impurity concentrations therein are different from each other, may be repeated in the main semiconductor layer. For obtaining sufficient effects by the structure described above, it is preferable to set the ratio of the highest impurity concentration and the lowest impurity concentration to be 2 or more. In the trench-gate IGBT's, it is not always necessary for the pitch, at which a pair of the lightly doped semiconductor layer and the extremely lightly doped semiconductor layer is repeated, to be constant. In the planar-gate IGBT's, the extending direction of the lightly doped semiconductor layers and the extremely lightly doped semiconductor layers may cross the extending direction of the p-type channel region at any angle between the 90 degrees of angle and the 45 degrees of angle.

The dimensions and impurity concentrations in the descriptions of the modes for carrying out the invention are exemplary and not restrictive on carrying out the invention. In the modes for carrying out the invention described above, the first conductivity type is an n-type and the second conductivity type a p-type. Alternatively, the first conductivity type may be a p-type and the second conductivity type an n-type with no problem. The invention is applicable also to the diodes. By applying the present invention, a vertical diode, that improves the forward-voltage reverse-recovery-loss tradeoff characteristics and the soft switching performances at the same time, is obtained.

The semiconductor devices according to the invention are useful for vertical power semiconductor devices, especially for IGBT's and diodes.

The invention has been described with reference to certain preferred embodiments thereof. It will be understood, however, that modifications and variations are possible within the scope of the appended claims.

This application is based on and claims priority to Japanese Patent Application 2008-128697, filed on May 15, 2008. The disclosure of the priority application in it entirety, including the drawings, claims and the specification thereof, is incorporated herein by reference.

What is claimed is:

1. A semiconductor device comprising:
a main semiconductor layer of a first conductivity type having a first major surface and a second major surface, the main semiconductor layer comprising an impurity concentration distribution, wherein the impurity concentration distribution in the main semiconductor layer comprises a relatively heavily doped layer and a relatively lightly doped layer shaped with respective stripes and alternately arranged repeatedly in a direction parallel to the first major surface of the main semiconductor layer, and wherein an interval of the impurity concentration distribution in the main semiconductor layer and an interval of arranging a gate electrode structure comprising the gate insulator film and the gate electrode are different from each other;
a channel region of a second conductivity type on a side of the first major surface of the main semiconductor layer;
an emitter region of the first conductivity type in the channel region;
an emitter electrode connected electrically to the emitter region and the channel region;
a region of the first conductivity type in the main semiconductor layer, the region of the first conductivity type being in contact with the channel region;
a gate insulator film in contact with the channel region between the region of the first conductivity type and the emitter region;
a gate electrode in contact with the gate insulator film;
a collector layer of the second conductivity type on a side of the second major surface of the main semiconductor layer;
a collector electrode connected electrically to the collector layer; and
a field stop layer of the first conductivity type between the main semiconductor layer and the collector layer, wherein the field stop layer is doped more heavily than the main semiconductor layer.

2. The semiconductor device according to claim 1, wherein the impurity concentration distribution in the main semiconductor layer comprises a highest impurity concentration and a lowest impurity concentration, wherein an impurity concentration ratio thereof is equal to or greater than 2.

3. The semiconductor device according to claim 1, wherein the gate electrode is in a trench, formed from the first major surface through the channel region to the region of the first conductivity type in the main semiconductor layer and in contact with the channel region, with the gate insulator film interposed therebetween.

4. The semiconductor device according to claim 2, wherein the gate electrode is in a trench, formed from the first major surface through the channel region to the region of the first conductivity type in the main semiconductor layer and in contact with the channel region, with the gate insulator film interposed therebetween.

5. The semiconductor device according to claim 1, wherein the gate insulator film and the gate electrode are formed along the first major surface and in parallel to the first major surface.

6. The semiconductor device according to claim 2, wherein the gate insulator film and the gate electrode are formed along the first major surface and in parallel to the first major surface.

* * * * *